(12) United States Patent
Kasztenny

(10) Patent No.: US 10,312,041 B2
(45) Date of Patent: Jun. 4, 2019

(54) FREQUENCY MEASUREMENT FOR ELECTRIC POWER DELIVERY SYSTEM

(71) Applicant: Schweitzer Engineering Laboratories, Inc., Pullman, WA (US)

(72) Inventor: Bogdan Z. Kasztenny, Markham (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 371 days.

(21) Appl. No.: 15/356,234

(22) Filed: Nov. 18, 2016

(65) Prior Publication Data

US 2017/0146577 A1 May 25, 2017

Related U.S. Application Data

(60) Provisional application No. 62/257,890, filed on Nov. 20, 2015.

(51) Int. Cl.
*G01R 23/02* (2006.01)
*H01H 47/00* (2006.01)

(52) U.S. Cl.
CPC ............ *H01H 47/00* (2013.01); *G01R 23/02* (2013.01)

(58) Field of Classification Search
CPC ................................. H01H 47/00; G01R 23/02
See application file for complete search history.

(56) References Cited

U.S. PATENT DOCUMENTS

| | | |
|---|---|---|
| 4,636,909 A | 1/1987 | Brandt |
| 4,672,501 A | 6/1987 | Bilac |
| 4,715,000 A | 12/1987 | Premerlani |
| 4,829,298 A | 5/1989 | Fernandes |
| 5,006,846 A | 4/1991 | Granville |
| 5,224,011 A | 6/1993 | Yalla |

(Continued)

OTHER PUBLICATIONS

Hart, D., "A New Tracking and Phasor Estimation Algorithm for Generator", IEEE Transaction on Power Delivery, vol. 12, No. #, pp. 1064-1073, Jul. 1997.

(Continued)

*Primary Examiner* — Thienvu V Tran
*Assistant Examiner* — Pinping Sun
(74) *Attorney, Agent, or Firm* — Jared L. Cherry; Richard M. Edge

(57) ABSTRACT

Disclosed herein are systems and methods for estimating a period and frequency of a waveform. In one embodiment, a system may comprise an input configured to receive a representation of the input waveform. A period determination subsystem may perform an iterative process to determine the variable period of the input waveform. The iterative process may comprise selection of an estimated window length, determination of an autocorrelation value based on the estimated window length, determination of an adjustment value to the window length to identify a maximum of the autocorrelation value; and determination of the variable period based on the window length associated with the maximum of the autocorrelation value. The period determination subsystem may perform the iterative process to track changes in the variable period of the input waveform. A control action subsystem may implement a control action based on the variable period of the input waveform.

20 Claims, 16 Drawing Sheets

(56) References Cited

U.S. PATENT DOCUMENTS

| | | | |
|---|---|---|---|
| 5,321,350 A * | 6/1994 | Haas | G01R 23/02 |
| | | | 324/76.11 |
| 5,398,029 A | 3/1995 | Toyama | |
| 5,446,682 A | 8/1995 | Janke | |
| 5,498,956 A | 3/1996 | Kinney | |
| 5,592,393 A | 1/1997 | Yalla | |
| 5,689,511 A * | 11/1997 | Shimazaki | H04B 1/707 |
| | | | 370/545 |
| 5,710,710 A * | 1/1998 | Owen | G01R 23/02 |
| | | | 324/76.48 |
| 5,721,689 A | 2/1998 | Hart | |
| 5,724,041 A * | 3/1998 | Inoue | G01S 7/285 |
| | | | 342/70 |
| 5,805,395 A | 9/1998 | Hu | |
| 5,809,045 A | 9/1998 | Adamiak | |
| 5,995,911 A | 11/1999 | Hart | |
| 6,141,196 A | 10/2000 | Premerlani | |
| 6,148,267 A | 11/2000 | Premerlani | |
| 6,236,949 B1 | 5/2001 | Hart | |
| 6,311,307 B1 | 10/2001 | Adamiak | |
| 6,313,614 B1 | 11/2001 | Persson | |
| 6,366,864 B1 | 4/2002 | Kulidjian | |
| 6,426,856 B1 | 7/2002 | Schneerson | |
| 6,446,682 B1 | 9/2002 | Viken | |
| 6,456,947 B1 | 9/2002 | Adamiak | |
| 6,571,182 B2 | 5/2003 | Adamiak | |
| 6,603,298 B2 | 8/2003 | Guzman-Casillas | |
| 6,662,124 B2 | 12/2003 | Schweitzer, III et al. | |
| 6,717,394 B2 | 4/2004 | Elms | |
| 6,845,333 B2 | 1/2005 | Anderson | |
| 6,934,654 B2 | 8/2005 | Benmouyal | |
| 7,328,114 B2 | 2/2008 | Premerlani | |
| 8,054,051 B2 * | 11/2011 | Nagata | H02P 9/006 |
| | | | 290/40 R |
| 8,065,140 B2 * | 11/2011 | Sakurai | G10L 25/90 |
| | | | 375/241 |
| 8,140,283 B2 | 3/2012 | Benmouyal | |
| 8,706,309 B2 * | 4/2014 | Schweitzer, III | H02J 3/12 |
| | | | 700/291 |
| 8,749,422 B1 * | 6/2014 | Moore | G11C 27/02 |
| | | | 341/120 |
| 2001/0012984 A1 | 8/2001 | Adamiak | |
| 2003/0011352 A1 | 1/2003 | Guzman-Casillas | |
| 2004/0186669 A1 | 9/2004 | Benmouyal | |
| 2006/0069522 A1 | 3/2006 | Bruno | |
| 2006/0247874 A1 | 11/2006 | Premerlani | |
| 2007/0008033 A1 | 1/2007 | Okazaki | |
| 2007/0086134 A1 | 4/2007 | Zweigle | |
| 2007/0136013 A1 | 6/2007 | Premerlani | |
| 2009/0254291 A1 | 10/2009 | Benmouyal | |
| 2010/0161263 A1 | 6/2010 | Benmouyal | |
| 2010/0225524 A1 * | 9/2010 | Szajnowski | G01R 23/02 |
| | | | 342/98 |
| 2014/0327574 A1 * | 11/2014 | Achanta | G01S 19/215 |
| | | | 342/357.59 |

OTHER PUBLICATIONS

Sezi, T., "A New Method for Measuring Power System Frequency", IEEE Transmission and Distribution, vol. 1, pp. 400-405, IEEE, 1999.

Maohai Wang, Yuanzhang Sun, "A Practical, Precise Method for Frequency Tracking and Phasor Estimation", IEEE Transactions on Power Delivery, vol. 19., No. 4, Oct. 2004.

Gabriel Benmouyal, An Adaptive Sampling-Interval Generator for Digital Relaying, IEEE Transactions on Power Delivery, vol. 4, No. 3, Jul. 1989.

Gabriel Benmouyal, "Removal of DC-Offset in Current Waveforms Using Digital Mimic Filtering", IEEE Transactions on Power Delivery, vol. 10, No. 2, Apr. 1995.

Bijoy Chattopadhyay, et al., "A New Frequency Measurement Algorithm in the Presence of Harmonics Using Instantaneous Phasors Quantities", CCECE, 1996.

Daqing Hou, "Relay Element Performance During Power System Frequency Excursions", Aug. 2007.

Moore, P.J., et al., "Frequency Relaying Based on Instantaneous Frequency Measurement", IEEE, 1996.

Phadke, A.G., et al., "A New Measurement Technique for Tracking Voltage Phasors, Local System Frequency, and Rate of Change of Frequency", IEEE Transactions on Power Apparatus and Systems, 1983.

M.S. Sachdev, M.A. Baribeau, "A New Algorithm for Digital Impedance Relays", IEEE Transactions on Power Apparatus and Systems, vol. PAS-98, No. 6, Nov. 1979.

E.O. Schweitzer, III, Daqing Hou, "Filtering for Protective Relays", 47th Georgia Tech Protective Relaying Conference, Apr. 28-30, 1993.

Sezi, T., "A New Method for Measuring Power System Frequency", NWPPA Engineering and Operations Conference, Spokane, WA, Apr. 17-21, 2000.

T.S. Sidhu, M.S. Sachdev, An Iterative DSP Technique for Tracking Power System Frequency and Voltage Phasors, IEEE, 1996.

Stenbakken, Gerard, et al., "Reference Values for Dynamic Calibration of PMUs", Proceedings of the 41st Hawaii International Conference on System Sciences, Jan. 7, 2008.

Liancheng Wang, "Frequency Response of Phasor-Based Microprocessor Relaying Algorithms", IEEE Transactions on Power Delivery, vol. 14, No. 1, Jan. 1999.

Jun-Zhe Yang, Chih-Wen Liu, "A Precise Calculation of Power System Frequency and Phasor", IEEE Transactions on Power Delivery, vol. 15, No. 2, Apr. 2000.

PCT/US2009/038996 International Search Report and Written Opinion of the International Searching Authority, dated Jun. 4, 2009.

* cited by examiner

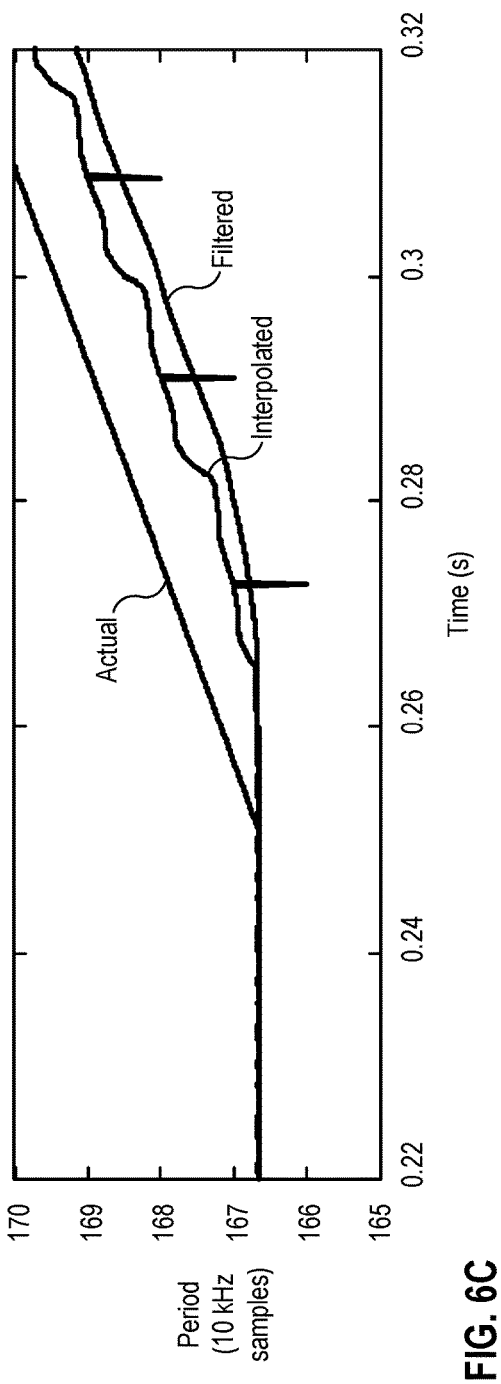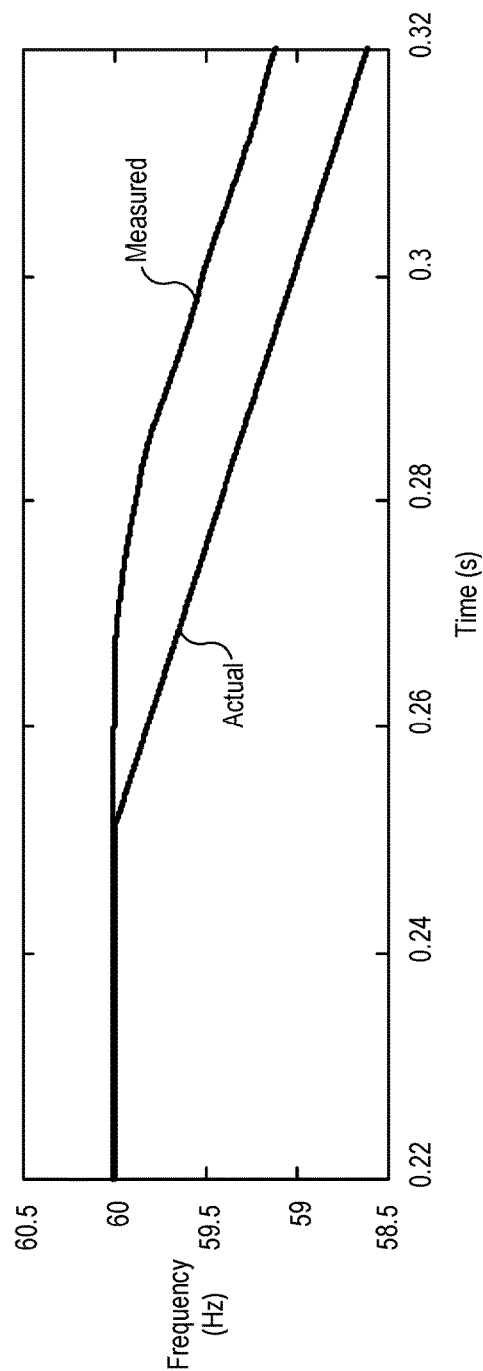

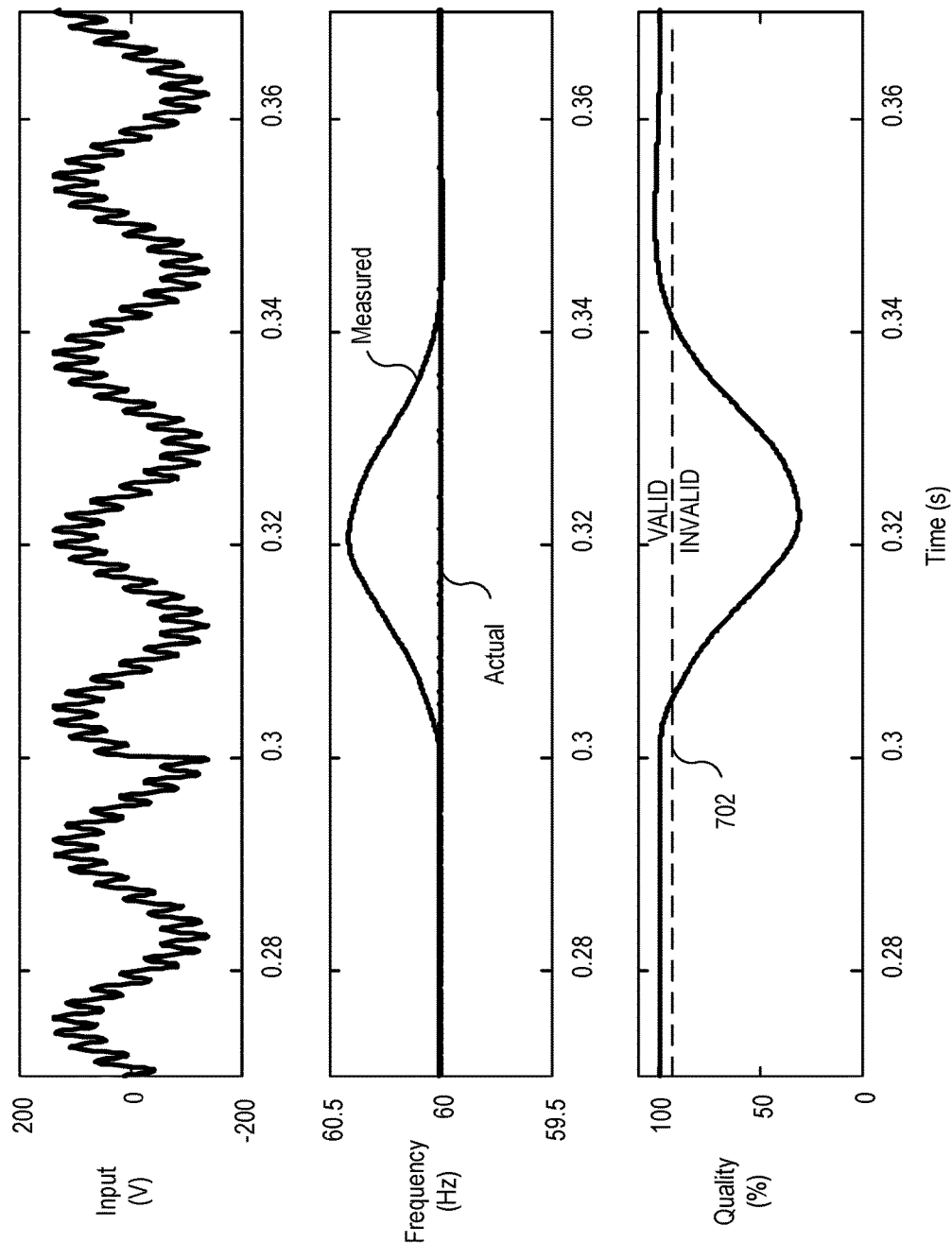

US 10,312,041 B2

FREQUENCY MEASUREMENT FOR ELECTRIC POWER DELIVERY SYSTEM

RELATED APPLICATION

The present application claims priority under 35 U.S.C. § 119(e) to U.S. Provisional Patent Application No. 62/257,890, filed Nov. 20, 2015, and titled "Frequency Measurement for Electric Power Delivery Systems," which is incorporated herein by reference in its entirety. The present application claims priority under 35 U.S.C. § 120 to U.S. patent application Ser. No. 15/048,674, filed Feb. 19, 2016, and titled "Estimation of a Waveform Period."

TECHNICAL FIELD

This disclosure relates to systems and methods for estimation of a waveform period and frequency. More particularly, this disclosure relates to calculating an estimate of a period of a waveform as a time shift that either maximizes a function of the waveform and the waveform after the time shift, or determines a zero crossing of a function of a waveform's derivative and the waveform after the time shift.

BRIEF DESCRIPTION OF THE DRAWINGS

Non-limiting and non-exhaustive embodiments of the disclosure are described, including various embodiments of the disclosure with reference to the figures included in the detailed description.

FIG. 6B illustrates a plot over time of the actual period, the raw period interpolated between samples, and the final period estimate after low-pass filtering, for a portion of the time illustrated in FIG. 6A.

FIG. 6C illustrates a plot over time of the actual and measured frequencies over time consistent with embodiments of the present disclosure.

FIG. 7 illustrates plots over time of an input voltage waveform including harmonics and a switching event, an actual and a measured frequency associated with the input signal, and a quality-of-measurement value consistent with embodiments of the present disclosure.

DETAILED DESCRIPTION

Figure 1:
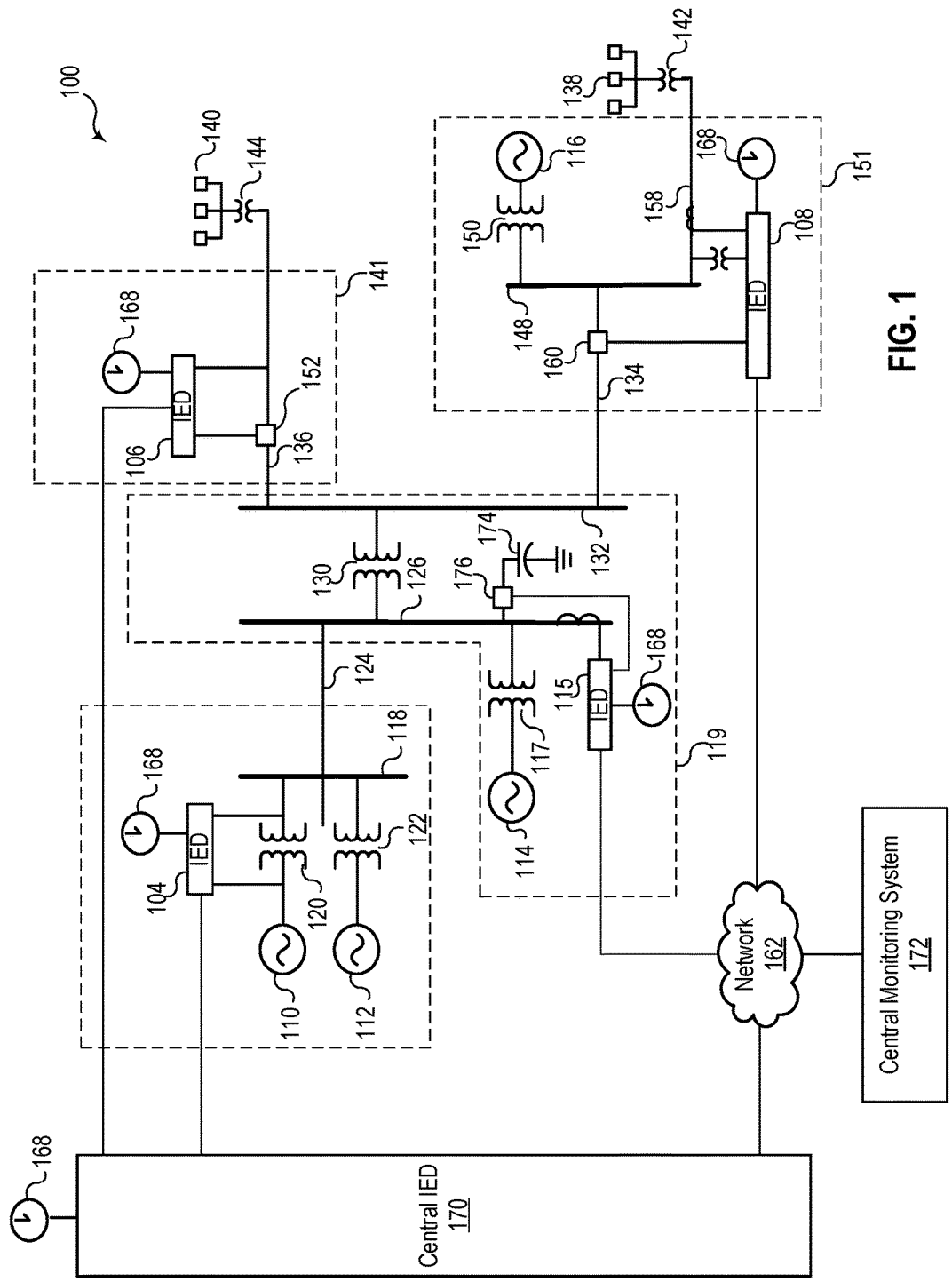
FIG. 1 illustrates a simplified one-line diagram of an electric power transmission and distribution system consistent with embodiments of the present disclosure.

The present disclosure pertains to systems and methods for identifying a period of a periodic (i.e. repeating) waveform. Determination of the frequency of a waveform may be applied in various applications. In one specific application, the systems and methods disclosed herein may be applied to an electrical power system. Analysis of the frequency of an electric power system may be applied to frequency control and frequency protection, including load shedding and overexcitation protection. Frequency determination may also be used in synchrophasor measurements and in protective relays and meters for frequency tracking in order to keep alternating current measurements, especially phasors, accurate.

As used herein, a period is a time shift that may be applied to the waveform in order for it to repeat. Real-world signals, such as the frequency of an electrical power system, are typically in a state of constant fluctuation. Such fluctuations in an electric power system may be created as generators oscillate around equilibrium points in a stable power system and fluctuations in the loads placed on such generators. Major system events can cause pronounced oscillations as generators speed up and slow down with respect to the rest of the power system. Some network configurations may lead to resonant conditions causing subsynchronous oscillations. As a result, power system voltages and currents are never in a perfect steady state and, therefore, are not precisely periodic.

Systems and methods consistent with the present disclosure may utilize an autocorrelation of the waveform or correlation of the waveform and its derivative using a freely chosen window length. One period of the waveform is a logical choice for the length of the correlation window. A window of half of a period is insufficient because the input waveform in general does not have to be anti-symmetrical with respect to the mid-point of the period (i.e., $x(t-T/2)$ does not have to equal $-x(t)$). Using multiple periods adds latency, and at least in theory, it does not contribute additional information. The exact one period is the minimum required and the logical choice; however, other considerations may also be utilized to select an autocorrelation window.

A period of a periodic waveform is the time shift $T_0$ for which an integral over a time period $T_0$ of the product of the waveform and the waveform shifted by $T_0$ is at its maximum. In other words:

$$A(t,T) = \int_{t-T}^{t} x(t) \cdot x(t-T) dt \qquad \text{Eq. 1A}$$

$$T_0(t) = T \text{ for which } A(t,T) \text{ is at its maximum} \qquad \text{Eq. 1B}$$

As the waveform is shifted by T and integrated over T, the value of integral may increase with T even if T is different than the precise period of the waveform. The increase is not due to improved correlation, but because the function is integrated over a longer period of time. Accordingly, in various embodiments, the value of Eq. 1 may be normalized based on the length of the window.

The period of a periodic (i.e. repeating) waveform may be determined using Eq. 2A and 2B. In Eq. 2A and 2B is the time shift $T_0$ for which an integral over a time period $T_0$ of the product of the waveform and the waveform shifted by $T_0$, normalized with the wave magnitude, is at its maximum.

$$A(t,T) = \frac{\int_{t-T}^{t} x(t) \cdot x(t-T) dt}{\int_{t-2T}^{t} x(t) \cdot x(t) dt} \qquad \text{Eq. 2A}$$

$$T_0(t) = T \text{ for which } A(t,T) \text{ is at its maximum} \qquad \text{Eq. 2B}$$

For a periodic waveform $A(t,T_0)$ the value of Eq. 2A is 1. For a near-periodic waveform such as during a frequency ramp and/or a magnitude ramp or oscillation the $A(t,T_0)$ value of Eq. 2A is below 1, but close to 1. For a non-periodic waveform such as for a phase or magnitude jump the value of Eq. 2A is considerably below 1. As a result, in various embodiments the value of Eq. 2A may provide a quality indicator reflecting the periodicity of the waveform. A waveform may be considered periodic if $A(t,T_0)$ exceeds a specific threshold. In one specific embodiment, a waveform may be considered periodic if $A(t,T_0) > 0.95$. Other embodiments may vary the threshold on various factors, including rate of change of a signal, the magnitude of the frequency, or other parameters of the signal. An evaluation of the periodicity of a signal may be determined at any arbitrary point in time, t. In one embodiment, a sliding data window of two waveform periods may be used to evaluate Eq. 2A.

Eq. 2 may be well suited for off-line applications or embodiments having ample computing power. In other embodiments, the latency of a system consistent with the present disclosure may be improved or the computational requirements may be reduced by using a more computationally efficient algorithm. Solving Eq. 2 to find a maximum contributes to the computational complexity. Accordingly, in alternative embodiments, a zero-crossing function may be used rather than identifying a maximum. Finding the zero-crossing may be numerically simpler, and thus may decrease latency or decrease the computational requirements or latency of a system consistent with the present disclosure.

A periodic signal may include multiple components, including a fundamental frequency and a number of harmonic components. The harmonic components are multiples of the fundamental frequency. For a sinewave signal (or a component of a sinewave sign), the signal and its time derivative are orthogonal, i.e. are shifted by 90 electrical degrees at the frequency of the said signal. As a result of this orthogonality, the sum of the signal and its derivative taken over the period of the said signal is zero. Moreover, the sum over any number of periods is zero. In addition, a sum of the product of two different harmonics over a period of the lower harmonic is zero. Accordingly, as expressed in Eqs. 3A and 3B, a period of a periodic (i.e. repeating) waveform $T_0$ corresponds to the length of a integration window for which the integral of the product of the signal $x(t-T)$ shifted by $T_0$ and its time derivative, $x'$, is zero. In other words:

$$B(t,T) = \int_{t-T}^{t} x(t-T) \cdot x'(t) dt \qquad \text{Eq. 3A}$$

$$T_0(t) = T \text{ for which } B(t,T) \text{ is at zero} \qquad \text{Eq. 3B}$$

Alternatively, the shift may be applied to the signal derivative instead of the signal, as expressed in Eq. 3C.

$$B(t,T) = \int_{t-T}^{t} x'(t-T) \cdot x(t) dt \qquad \text{Eq. 3C}$$

Solving Eq. 3 to find a zero may provide a numerically simpler calculation in comparison to solving Eq. 2A to find a maximum. As described above, Eq. 2A may also be used to assess the periodicity of a waveform, and thus, to assess the quality of a resulting determination of the determined period of the waveform. In cases where the waveform is not periodic, the determined period may be of limited use. In some embodiments, Eq. 3 may be used to determine the period of waveform, and Eq. 2 may be used to assess the quality of the determination of the period. In other words, a period determined using Eq. 3A, may serve as an input to Eq. 2A, which may provide an indication of whether the signal is truly periodic. Eq. 2 may be referred to in certain embodiments as a periodicity determination function, and Eq. 3 may be referred to as a period determination function. Of course, other equations or representations may also be used to determine the period and periodicity of a waveform consistent with the present disclosure.

When Eq. 3A is calculated for a period T that is shorter than the actual period $T_0$, the function per Eq. 3A is positive, and when calculated for a period T that is longer than the actual period $T_0$, the function is negative. Accordingly, if the value of Eq. 3A is positive a present period estimate may be increased. Similarly, if the value of Eq. 3A is negative a present period estimate may be decreased. Further, the value of Eq. 3A does not change substantially when calculated for two consecutive samples. As a result, a system implementing Eq. 3A may calculate the equation once for any given point in time, and the system may increase or decrease the period estimate for the calculation of the period determination function for the next data sample. If the sampling frequency is sufficiently high (e.g. 4 kHz or higher), the process is stable even for high rates-of-change of frequency. The value of the period (i.e., the shift in the signal) is not limited to integer multiples of samples. In some embodiments, interpolation may be used to determine non-integer multiples of samples while maintaining computational efficiency.

Eq. 2 effectively looks at the data window between t and t−2*T. Certain embodiments consistent with the present disclosure may tag the measurement with respect to the middle of an effective data window, as shown in Eq. 4A-4B.

$$A(t, T) = \frac{\int_{t}^{t+T} x(t) \cdot x(t-T)\, dt}{\int_{t-T}^{t+T} x(t) \cdot x(t)\, dt} \qquad \text{Eq. 4A}$$

$$T_0(t) = T \text{ for which } A(t, T) \text{ is at its maximum} \qquad \text{Eq. 4B}$$

Stated in other words, Eq. 4A may use the effective data window between t−T and t+T. Use of the effective data window between t−T and t+T may be well-suited for embodiments using synchrophasor frequency measurement because it introduces no group delay. In various embodiments, Eq. 4A-4B may be used as a definition of period/frequency for a power system signal is a quasi-steady state. The value of A(t,T) corresponding to the measured period may be communicated or checked locally and may assert a flag if the wave is periodic at the time.

In various embodiments, synchrophasors consistent with the C37.118 standard, may be used to represent measurements used in various embodiments of the present disclosure. A phasor may be defined as a sine wave that best estimates the periodic wave. In some embodiments, a least-error-squared fit algorithm may be used to determine the phasor parameters, which is the same as the fundamental frequency harmonic of the Fourier transform. Accordingly, an instantaneous phasor is a "frequency tracked" one-cycle Fourier. The phasor and period (frequency) may be calculated on the same data in various embodiments, and may constitute a coherent pair with the Fourier-based phasor by the virtue of using the same data points.

The foregoing concepts may be applied in various applications to determine the period and periodicity of time-varying signals. One specific application involves analyzing alternating current signals in an electric power distribution system. Variations in the frequency of an alternating current in an electric power distribution system provide information regarding the performance of the system. Such information may be used to control the electric power distribution system and enhance the stability or the reliability of the system.

Eq. 4A may define a period (frequency) at the time tag t, using the observations window t−T to t+T. This window may be independent from a reporting rate. Actual Phasor Measurement Units (PMUs) can implement any method to measure frequency consistent with the present disclosure. Eq. 4A defines a consistent reference for any arbitrary signal. One cycle Fourier defines what a phasor is. This is calculated at t using the data window of t−T/2 to t+T/2 (one cycle Fourier) or t−T to t+T (two-cycle Fourier), etc. The phasor and frequency pair is a coherent characterization of a period waveform at the point in time t. The time, t, is referenced to absolute time, and the angle of the phasor is referenced accordingly by placing the cosine and sine windows accordingly to the time tag. One cycle data window may facilitate communication of measured phasors at high rates. Where the data rate is not high enough to satisfy the sampling theorem, an anti-aliasing filter may be applied to the phasor and frequency.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 illustrates a simplified one-line diagram of an alternating current electric power transmission and distribution system 100 consistent with embodiments of the present disclosure. Electric power delivery system 100 may be configured to generate, transmit, and distribute electric energy to loads. Electric power delivery systems may include equipment, such as electric generators (e.g., generators 110, 112, 114, and 116), power transformers (e.g., transformers 117, 120, 122, 130, 142, 144 and 150), power transmission and delivery lines (e.g., lines 124, 134, 136, and 158), circuit breakers (e.g., breakers 152, 160, 176), busses (e.g., busses 118, 126, 132, and 148), loads (e.g., loads 140, and 138), capacitor banks 174, and the like. A variety of other types of equipment may also be included in electric power delivery system 100, such as voltage regulators, capacitor banks, and a variety of other types of equipment.

Substation 119 may include a generator 114, which may be a distributed generator, and which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line is monitored and/or controlled using IED 106, which may selectively open and close breaker 152. Load 140 may be fed from distribution line 136. Further step-down transformer 144 in communication with distribution bus 132 via distribution line 136 may be used to step down a voltage for consumption by load 140.

Distribution line 134 may lead to substation 151, and deliver electric power to bus 148. Bus 148 may also receive electric power from distributed generator 116 via transformer 150. Distribution line 158 may deliver electric power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electric power delivery system 100 may be monitored, controlled, automated, and/or protected using intelligent electronic devices (IEDs), such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

A common time signal may be distributed throughout system 100. Utilizing a common or universal time source may ensure that IEDs have a synchronized time signal that can be used to generate time synchronized data, such as synchrophasors. In various embodiments, IEDs 104, 106, 108, 115, and 170 may receive a common time signal 168. The time signal may be distributed in system 100 using a communications network 162 or using a common time source, such as a Global Navigation Satellite System ("GNSS"), or the like.

According to various embodiments, central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

Communication via network 162 may be facilitated by networking devices including, but not limited to, multiplexers, routers, hubs, gateways, firewalls, and switches. In some embodiments, IEDs and network devices may comprise physically distinct devices. In other embodiments, IEDs and network devices may be composite devices, or may be configured in a variety of ways to perform overlapping functions. IEDs and network devices may comprise multi-function hardware (e.g., processors, computer-readable storage media, communications interfaces, etc.) that can be utilized in order to perform a variety of tasks that pertain to network communications and/or to operation of equipment within system 100.

In various embodiments, IEDs 104, 106, 108, 115, and 170 may be configured to monitor the frequency of alternating current waveforms in system 100. The IEDs may utilize common time source 168 to time-align measurements for comparison across system 100. The measurements may be used to in connection with the systems and methods disclosed herein for control of system 100.

In various embodiments, a signal in system 100 may be representative of an operating condition of the electric power delivery system. In one embodiment, the signal may be a current signal obtained from the electric power delivery system using a current transformer or the like. A secondary of the current transformer may be in electrical communication with an IED configured to monitor the electric power delivery system, and which further may be configured to provide protection to the electric power delivery system. The IED may include further current transformers in electrical communication with the primary current transformer. The IED may also include an analog-to-digital (A/D) converter in communication with the current transformer to digitize samples of the obtained waveform. The IED may include a processor receiving such digitized samples (which may undergo further processing using, for example, filters and the like) and using the embodiments described herein, the IED may calculate a period of the waveform therefrom. In other embodiments, the waveform may be representative of a voltage of the electric power delivery system.

Figure 2A:
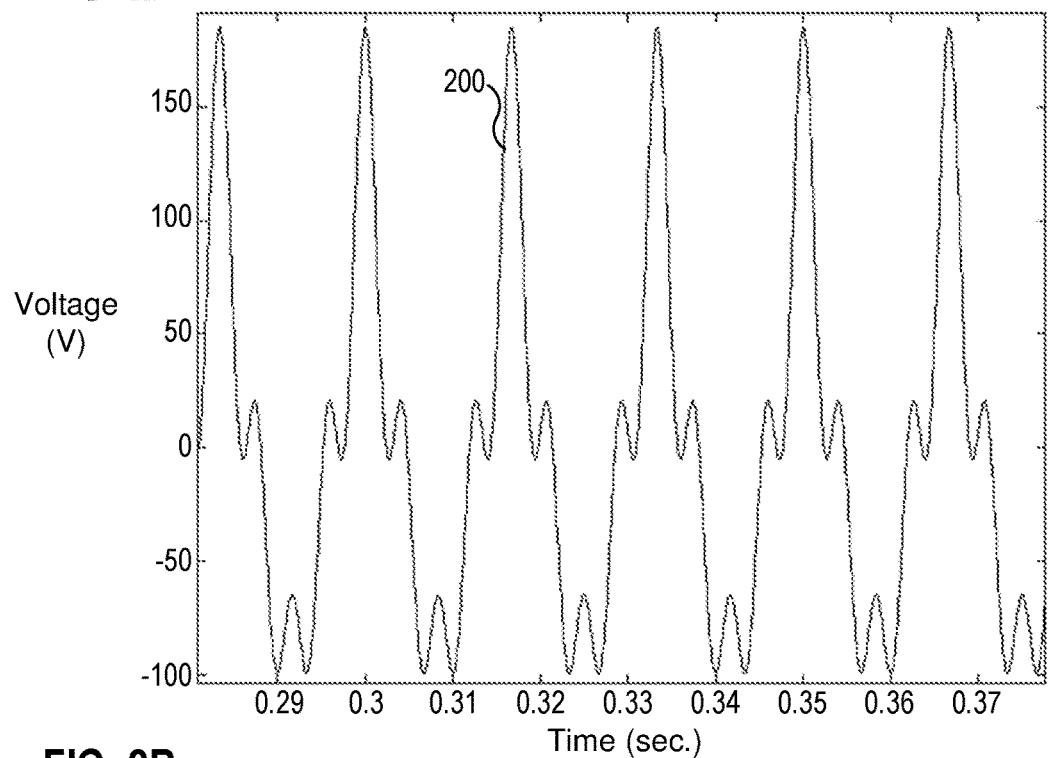
FIG. 2A illustrates a plot over time of a 60 Hz waveform with harmonics in a steady state consistent with embodiments of the present disclosure.

FIG. 2A illustrates a plot over time of a 60 Hz waveform 200 heavily distorted with harmonics in a steady state consistent with embodiments of the present disclosure. FIGS. 2A-2D illustrate an example of a process that may be used in various embodiments for determining a period of the waveform illustrated in FIG. 2A using techniques consistent with the present disclosure. The waveform illustrated in FIG. 2A is a distorted sinusoidal wave with a frequency of 60 Hz. In a system sampled at 10 kHz, the waveform would have a period of 166.667 samples. In connection with FIGS. 2B-2D, a sampling rate of 10 kHz is used, although other sampling rates could be utilized in connection with various embodiments.

In various embodiments, Eq. 2 may be implemented directly by replacing the continuous time integrals with sums of a plurality of samples. Interpolation can be used to find the maximum of Eq. 2 between two integer samples of T. Accordingly, the system may avoid use of another interpolation to delay the signal by exactly one period (including the fractional period), and the system may avoid another interpolation to run the sums over an exact period (including the fractional period). Instead, the system may run calculations for values of a period expressed in integer number of samples. A system configured to determine the period of waveform 200 may begin with an initial estimate of the period being the period measured in the previous measurement cycle.

Figure 2B:
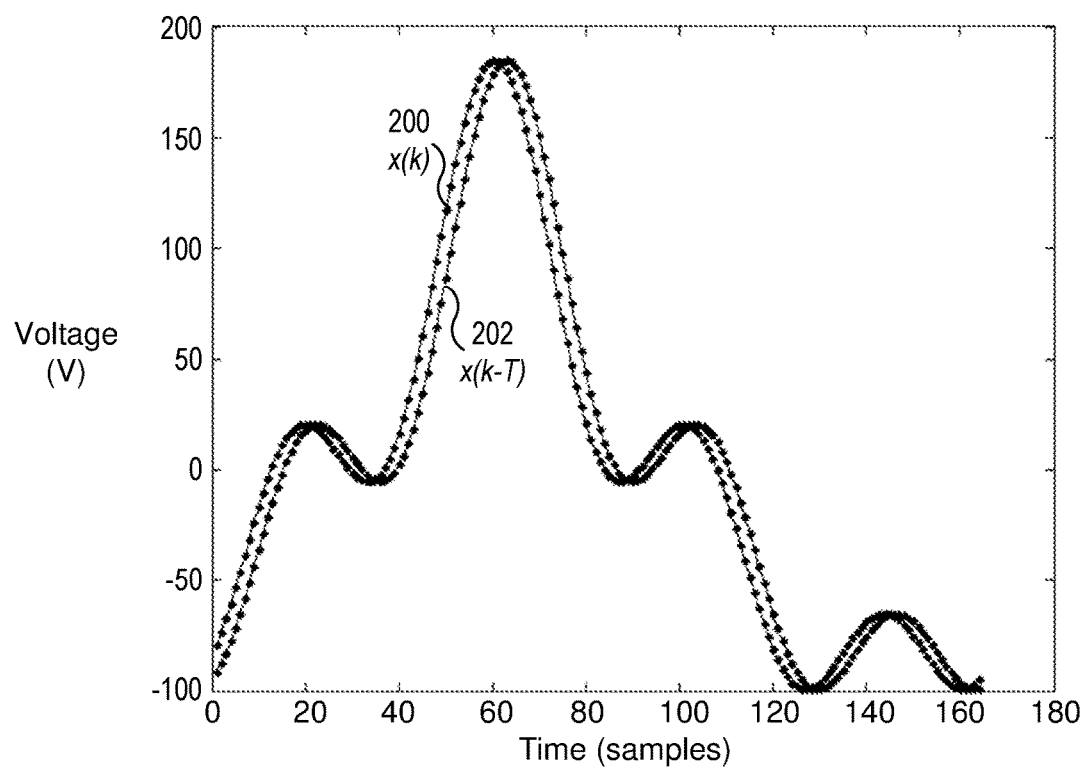
FIG. 2B illustrates one period of the waveform of FIG. 2A plotted against a sampling rate of 10 kHz, together with a first version of the waveform sampled at a first sampling rate consistent with one embodiment of the present disclosure.

FIG. 2B illustrates one period of the waveform 200 of FIG. 2A plotted against a sampling rate of 10 kHz, together with a first version of the waveform 202 shifted by a first value consistent with one embodiment of the present disclosure. The first time shift may represent the initial estimate of the period. In the illustrated example, the first time shift, or initial estimate, is 164 samples. The system may calculate Eq. 3A for T=164 samples and may determine that the result is positive. The positive result indicates that the value T=164 is below the actual period. Accordingly, the first version of the waveform 202 lags behind waveform 200. Eq. 2A may be evaluated for the scenario illustrated in FIG. 2B. At 164 samples per period, Eq. 2A yields a value of 0.9827. The value of Eq. 2A is relatively close to 1 given that the first sampling rate is relatively close to the actual sampling rate.

Figure 2C:
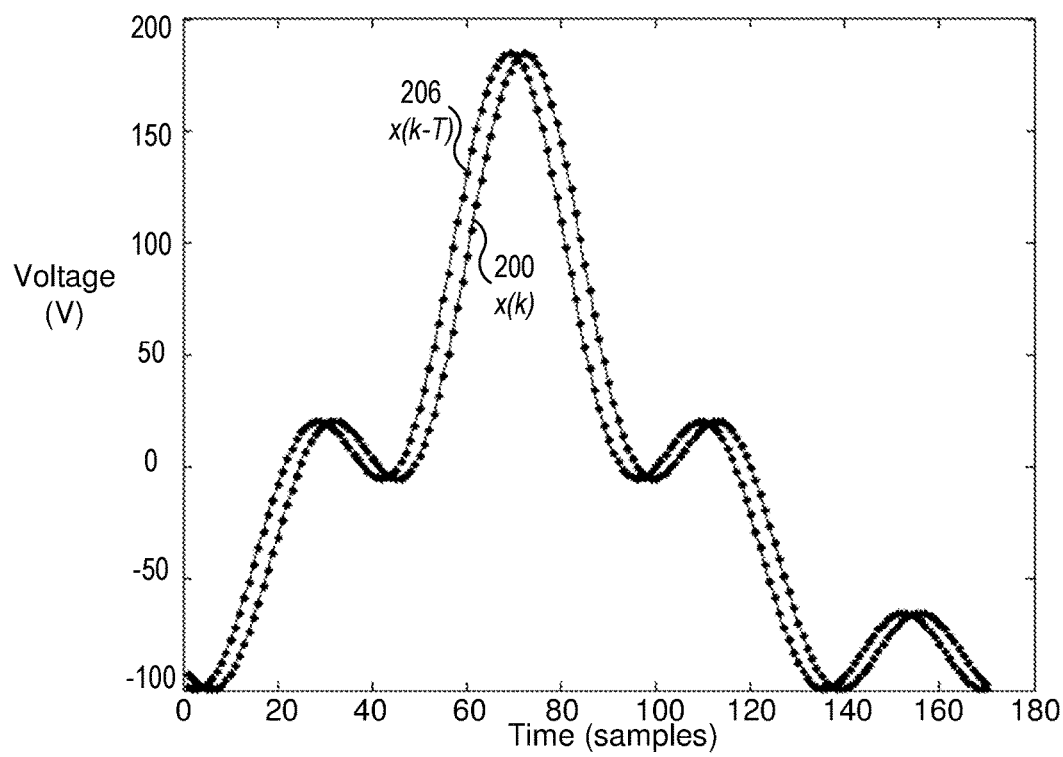
FIG. 2C illustrates one period of the waveform of FIG. 2A plotted against a sampling rate of 10 kHz, together with a second version of the signal sampled at a second sampling rate consistent with one embodiment of the present disclosure.

FIG. 2C illustrates one period of the waveform 200 of FIG. 2A plotted against a sampling rate of 10 kHz, together with a second version of the signal 206 shifted by a second time shift consistent with one embodiment of the present disclosure. As noted in connection with FIG. 2B, the value T=164 is below the actual period, and accordingly the estimate may be increased. In the illustrated example, the second time shift is increased to T=170, which is greater than the actual period. Accordingly, the second version of the waveform 206 leads waveform 200, and the value of Eq. 3B is negative. At 170 samples per period, Eq. 2A yields a value of 0.9743.

The change in the sign of the result of Eq. 3A provides an indication that the actual period is between T=164 and T=170. A simple algorithm limited to the period estimate in integer sample counts would oscillate the estimated period between 166 and 167 samples. Note that the straight average between 166 and 167 (166.5) does not reflect the true period of 166.6(6). Resampling would allow for the application of fractional shifts; however, resampling may utilize significant computational resources. The computational efficiency may be increased by using periods expressed in integer sample counts and interpolating if the result of Eq. 3A changes sign between two consecutive samples. In this example, interpolation between the two points (166 samples) and (167 samples) indicates a period of 166.67 samples. Accordingly, an algorithm consistent with the present disclosure may constantly track the zero of Eq. 3A. The interpolation allows for better accuracy. If the period determination function does not change signs between two consecutive samples, the algorithm uses the newest integer value of the period.

Figure 2D:
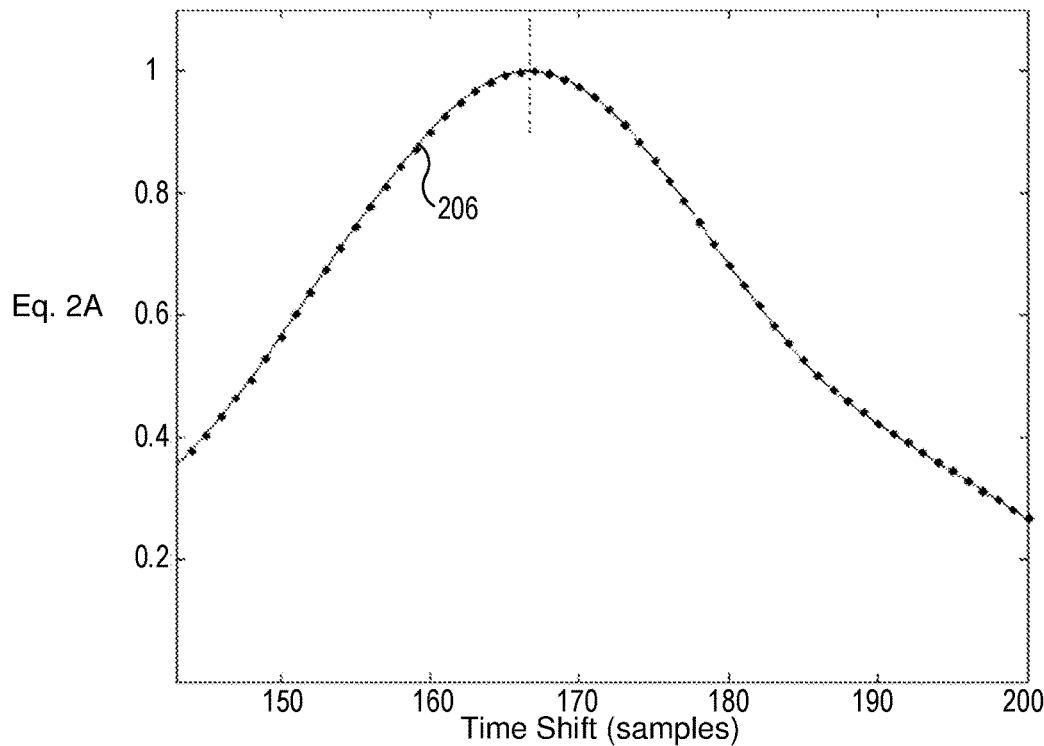
FIG. 2D illustrates a function representing a quality indicator over a range of time shift values, represented in terms of samples at 10 kHz, of the waveform illustrated in FIG. 2A.

FIG. 2D illustrates a function 206 which represents a quality indicator over a range of time shifts, represented in terms of samples at 10 kHz, of the waveform illustrated in FIG. 2A. As would be expected given that the signal is periodic and has a frequency of 60 Hz, function 206 reaches a maximum of 1 at a 166.667 samples. In some embodiments, the value may be obtained by interpolation between the period values of 166 and 167. The analysis illustrated in connection with FIGS. 2B-2D may be performed for an arbitrary waveform having an unknown period and unknown periodicity.

Figure 3A:
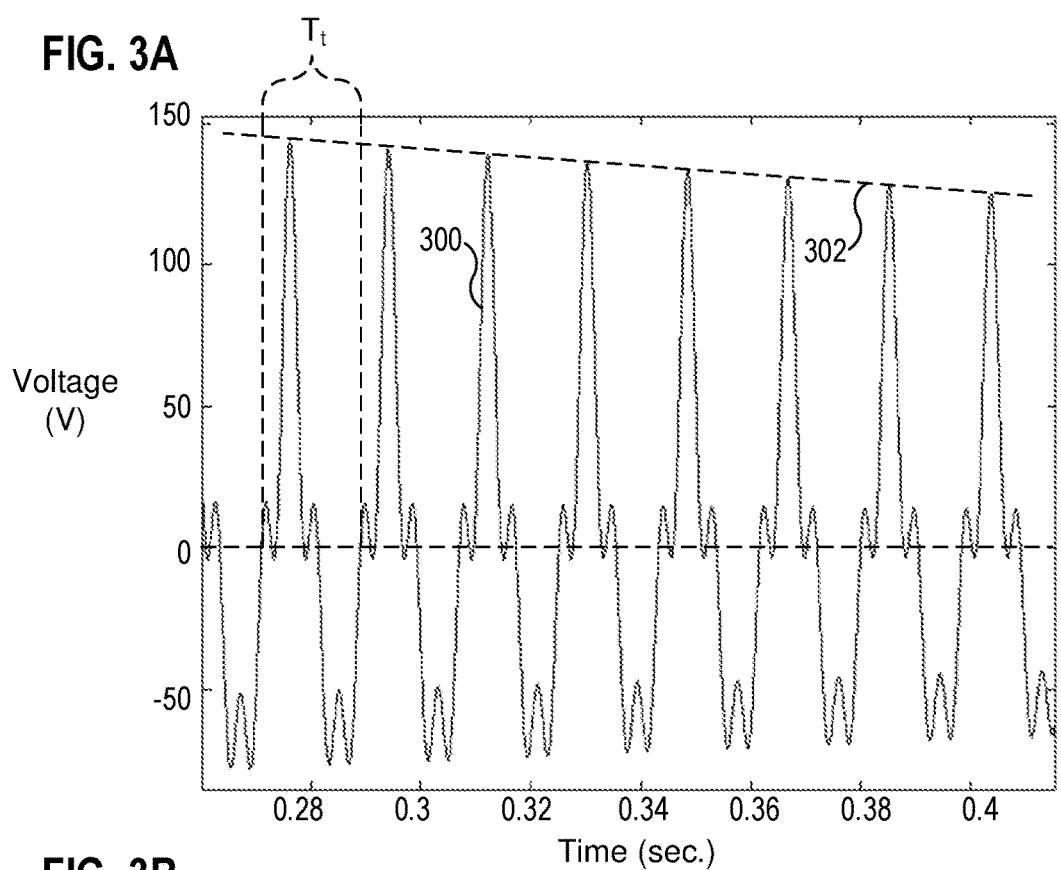
FIG. 3A illustrates a plot over time of a waveform including harmonics having a time-varying frequency and a time-varying magnitude consistent with embodiments of the present disclosure.
Figure 3B:
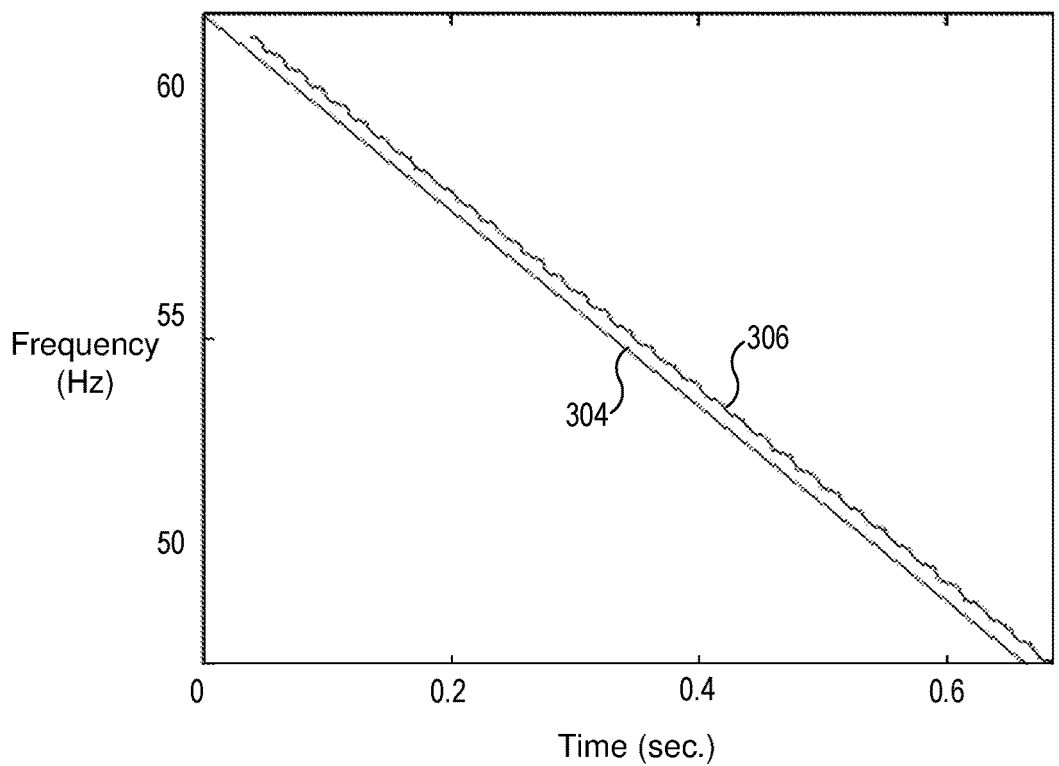
FIG. 3B illustrates an actual and a measured change in frequency over time of the waveform of FIG. 3A determined using a data selection window between t and t−2*T consistent with embodiments of the present disclosure.

FIG. 3A illustrates a plot over time of a waveform 300 heavily distorted with harmonics and having a time-varying frequency and a time-varying magnitude consistent with embodiments of the present disclosure. FIGS. 3A-3E illustrate a process for determining a period of the waveform illustrated in FIG. 3A using techniques consistent with the present disclosure. The time-varying change of the magnitude is indicated by line 302. The waveform illustrated in FIG. 3A is a waveform having a frequency change of −15 Hz per second, as best shown in FIG. 3B, and a magnitude change of −80% of initial value per second.

FIG. 3B illustrates an actual and a measured change in frequency over time of the waveform of FIG. 3A determined using a data selection window between t and t−2*T consistent with embodiments of the present disclosure. The rate of change of the frequency is −15 Hz per second. Line 304 reflects an actual frequency, and line 306 reflects a measured frequency. The delay between line 304 and line 306 may be attributable to a data selection window between t and t−2*T.

Figure 3C:
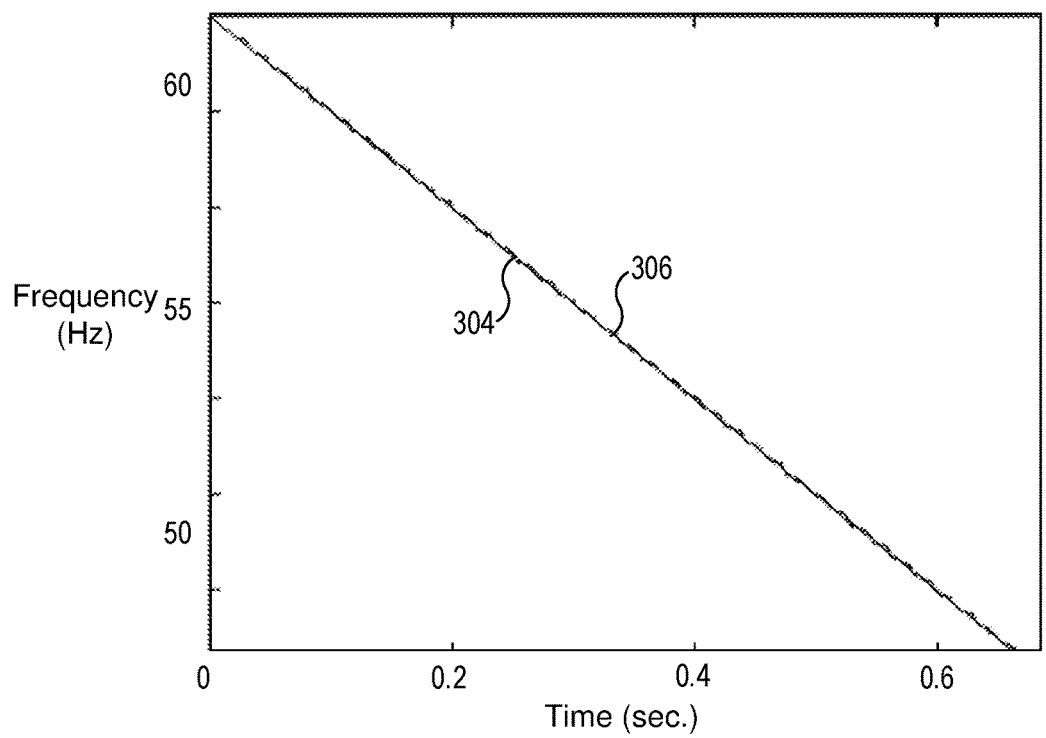
FIG. 3C illustrates an actual and a measured change in frequency over time of the waveform of FIG. 3A determined using a data selection window between t−T and t+T consistent with embodiments of the present disclosure.

FIG. 3C illustrates an actual and a measured change in frequency over time of the waveform of FIG. 3A determined using a data selection window between t−T and t+T consistent with embodiments of the present disclosure. As discussed above in connection with Eq. 4A, in certain embodiments, the effective data window may be used between t−T and t+T, rather than the data selection window between t and t−2*T used in connection with Eq. 2A. As may be appreciated by comparing FIG. 3B to FIG. 3C, there is no delay in FIG. 3C between the actual frequency and the measured frequency.

Figure 3D:
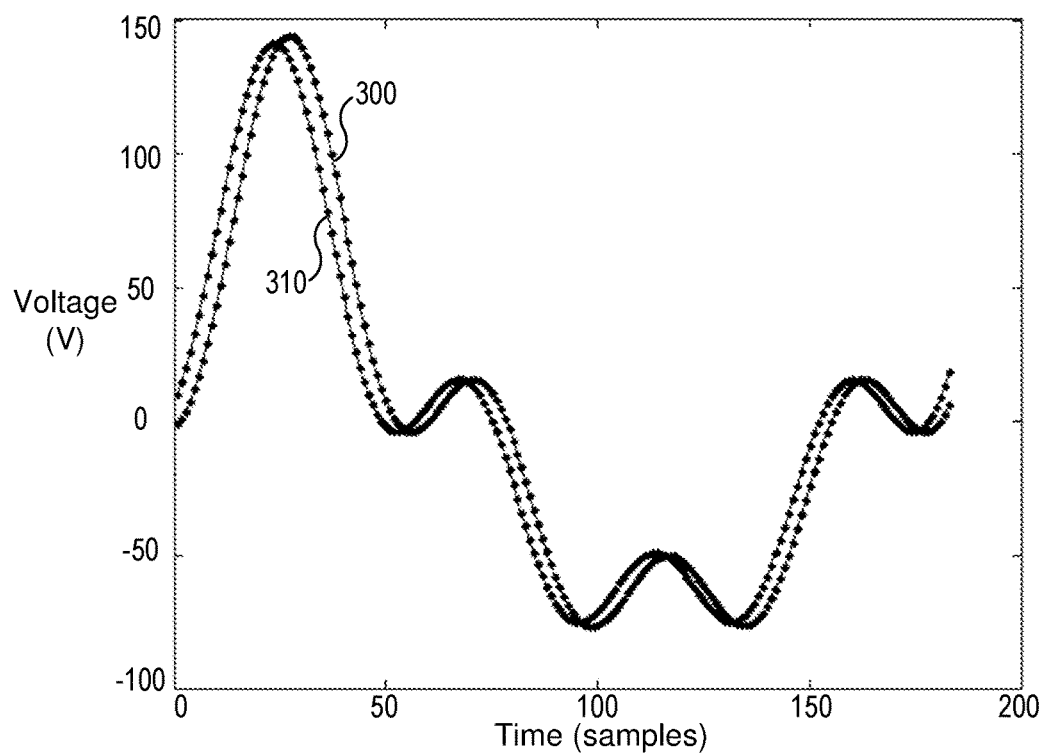
FIG. 3D illustrates one period of the waveform of FIG. 3A plotted against a sampling rate of 10 kHz, together with a first version of the waveform sampled at a first sampling rate consistent with one embodiment of the present disclosure.

FIG. 3D illustrates one period of the waveform 300 of FIG. 3A plotted against a sampling rate of 10 kHz, together with a first version of the waveform 310 time shifted by a first value consistent with one embodiment of the present disclosure. The first time shift, at 177 samples per period, is slightly lower than the actual period of the waveform 300. Accordingly, the first version of the waveform 310 lags behind waveform 300.

Figure 3E:
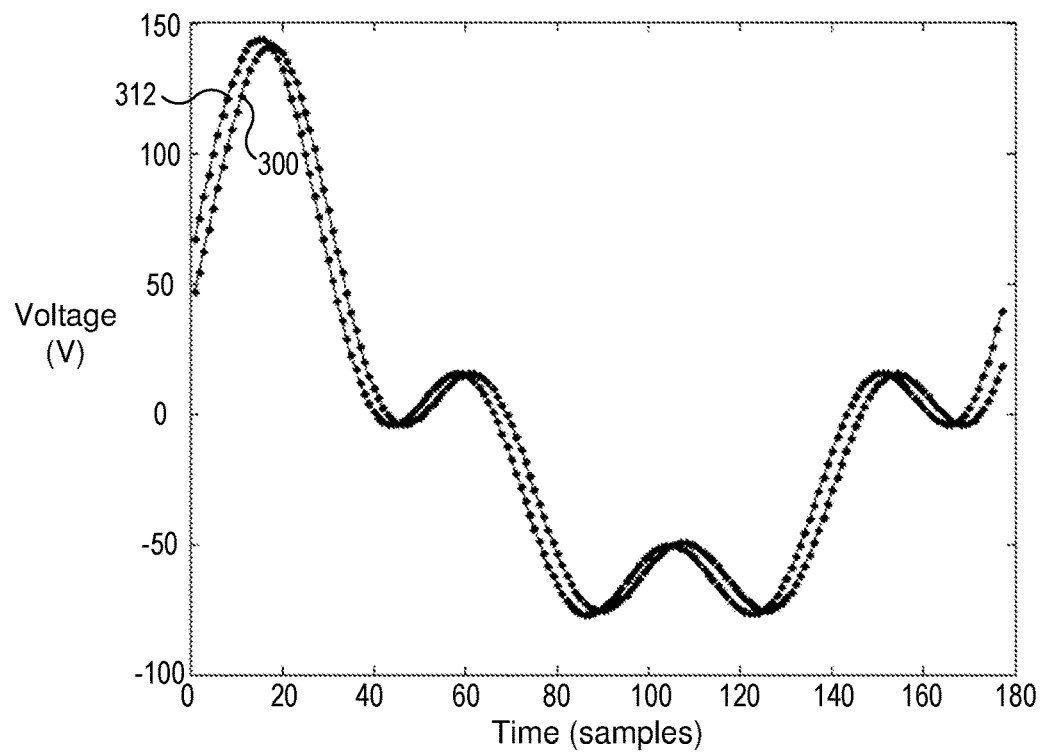
FIG. 3E illustrates one period of the waveform of FIG. 3A plotted against a sampling rate of 10 kHz, together with a second version of the signal sampled at a second sampling rate consistent with one embodiment of the present disclosure.

FIG. 3E illustrates one period of the waveform 300 of FIG. 3A plotted against a sampling rate of 10 kHz, together with a second version of the waveform 312 time shifted by a second value consistent with one embodiment of the present disclosure. The second time shift, at 183 samples per period, is slightly higher than the actual period of waveform 300. Accordingly, the second version of the waveform 312 leads waveform 300.

Figure 3F:
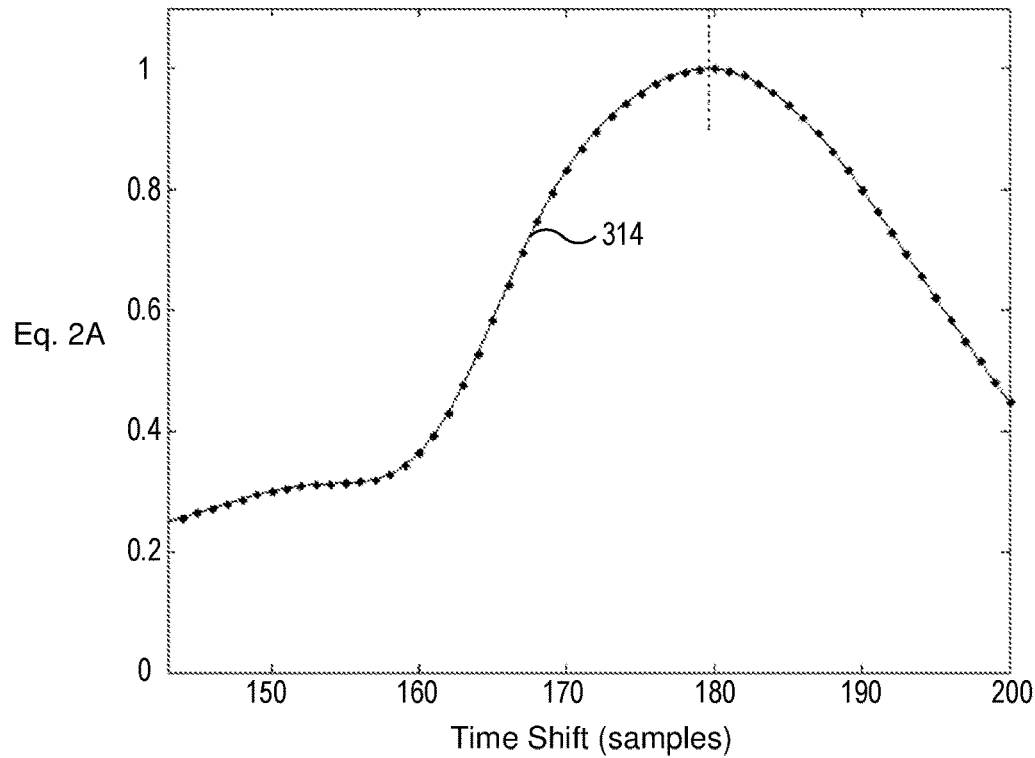
FIG. 3F illustrates a function representing a quality indicator over a range of time shift values, represented in terms of samples at 10 kHz, of the waveform illustrated in FIG. 3A consistent with embodiments of the present disclosure.

FIG. 3F illustrates a function 314 representing a quality indicator Eq. 2A over a range of time shifts, represented in terms of samples at 10 kHz, of the waveform illustrated in FIG. 3A consistent with embodiments of the present disclosure. The maximum equals 0.9997, signifying the waveform is highly periodic, at 179.64 samples per period. In some embodiments, the maximum value may be obtained by interpolation between certain period values. The analysis illustrated in connection with FIGS. 3D-3F may be performed for an arbitrary waveform having an unknown period and unknown periodicity.

Figure 4A:
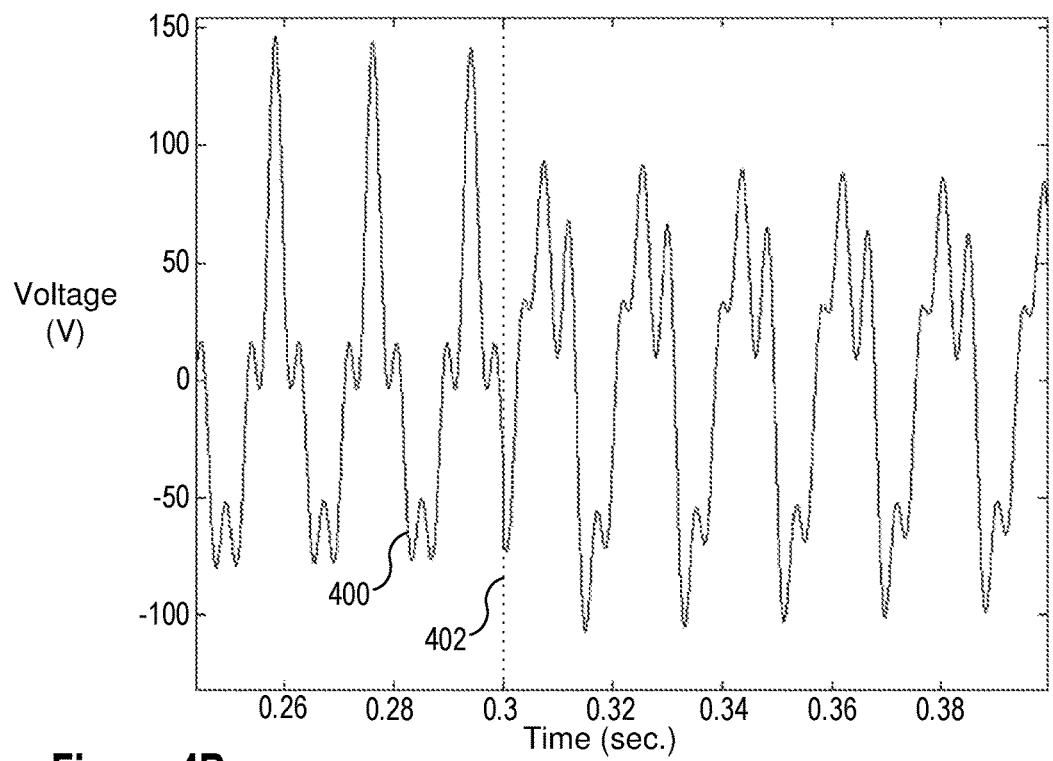
FIG. 4A illustrates a plot over time of a waveform including harmonics having a time-varying frequency, a time-varying magnitude, and a phase jump consistent with embodiments of the present disclosure.

FIG. 4A illustrates a plot over time of a waveform 400 heavily distorted with harmonics, having a time-varying frequency, a time-varying magnitude, and a phase jump at a time designated by line 402. The time-varying frequency and time-varying magnitude of waveform 400 is the same as waveform 300, with the exception of the 90° phase jump at t=0.3 sec. Events that shift the angle of a waveform affects the periodicity of the waveform. Such events may include switching events in an electric power distribution system. Switching events cause the zero crossings to shift instantly, creating very large frequency measurement errors when using the zero-crossing method. Such errors may be filtered out by rejecting wrong measurements rather than by averaging, hence the use of various heuristic approaches to validating or rejecting such raw measurements.

Methods consistent with the present disclosure may run at a fixed rate, such as each time a new input waveform sample becomes available. A fixed schedule makes raw frequency post-filtering more straightforward. As with any frequency measuring method, the method behaves poorly for nonperiodic waveforms.

Figure 4B:
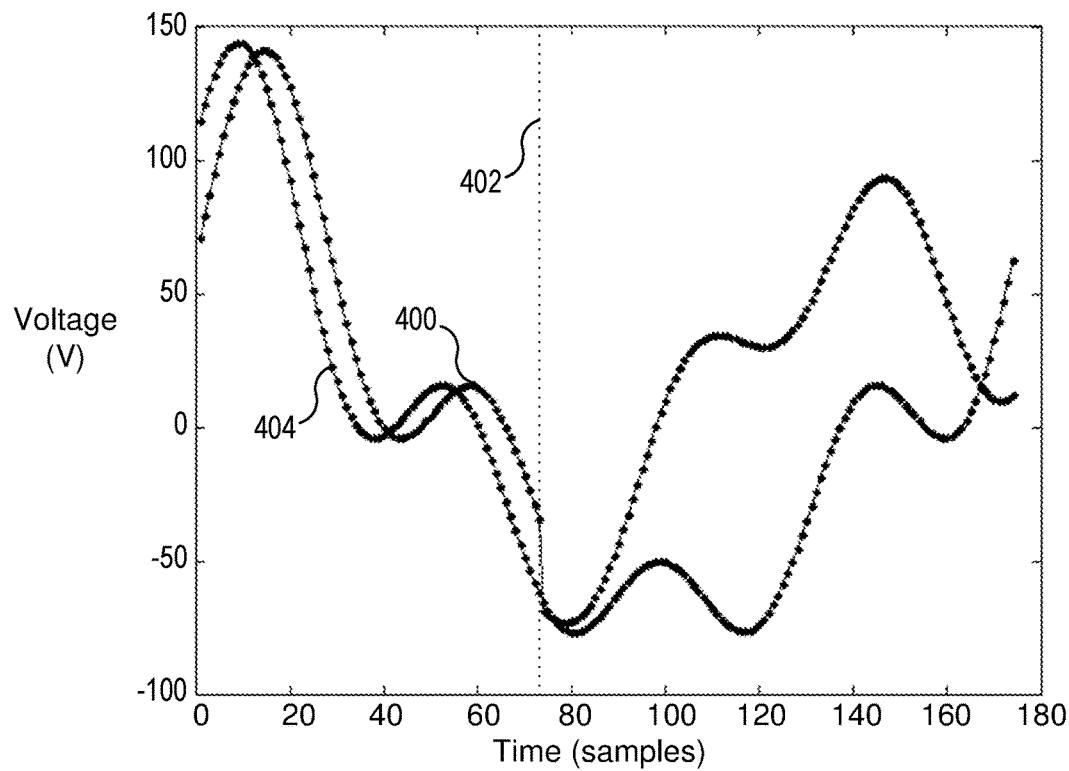
FIG. 4B illustrates one period of the waveform of FIG. 4A plotted against a sampling rate of 10 kHz, together with a first version of the waveform sampled at a first sampling rate consistent with one embodiment of the present disclosure.

FIG. 4B illustrates one period of the waveform 400 of FIG. 4A plotted against a sampling rate of 10 kHz, together with a first version of the waveform 404 shifted by a first value consistent with one embodiment of the present disclosure. The first time shift is 177 samples per period. Following the phase jump at the time indicated by line 402, the second waveform 404 begins to deviate substantially from waveform 400.

Figure 4C:
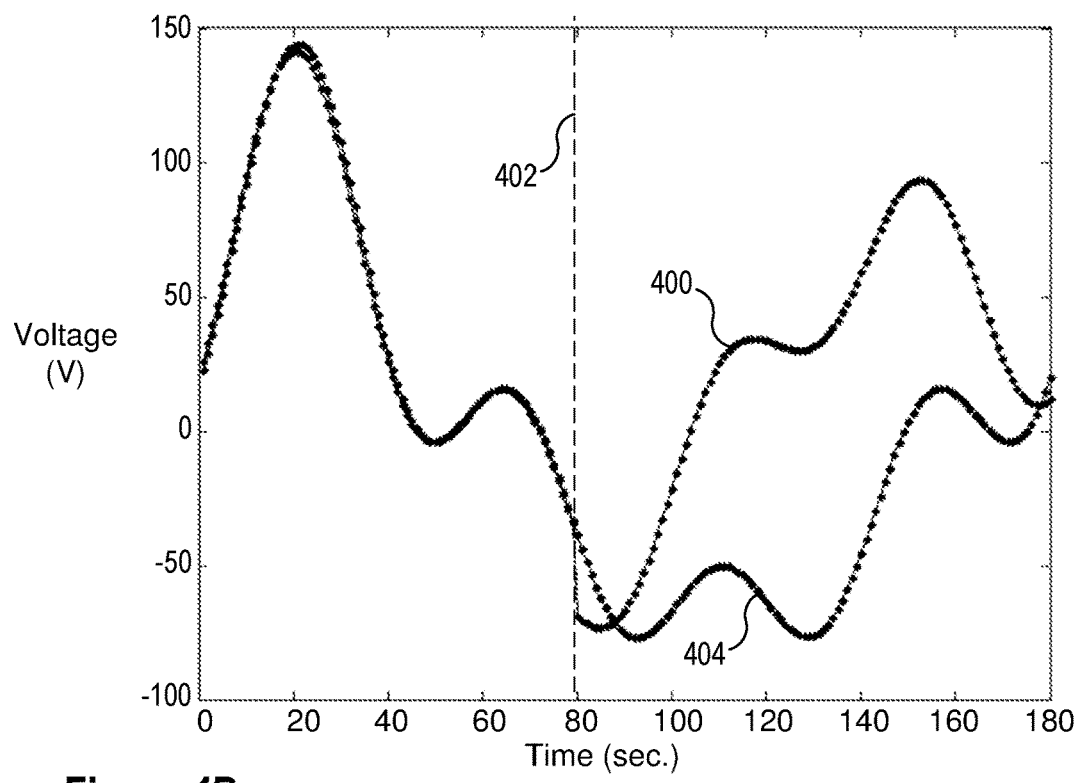
FIG. 4C illustrates one period of the waveform of FIG. 4A plotted against a sampling rate of 10 kHz, together with a second version of the signal sampled at a second sampling rate consistent with one embodiment of the present disclosure.

FIG. 4C illustrates one period of the waveform 400 of FIG. 4A plotted against a sampling rate of 10 kHz, together with a second version of the signal 404 shifted by a second value consistent with one embodiment of the present disclosure. The second time shift, at 180 samples per period, closely correlates to waveform 400 prior to the phase jump at the time indicated by line 402. Following the phase jump at the time indicated by line 402, the second waveform 404 begins to deviate substantially from waveform 400.

Figure 4D:
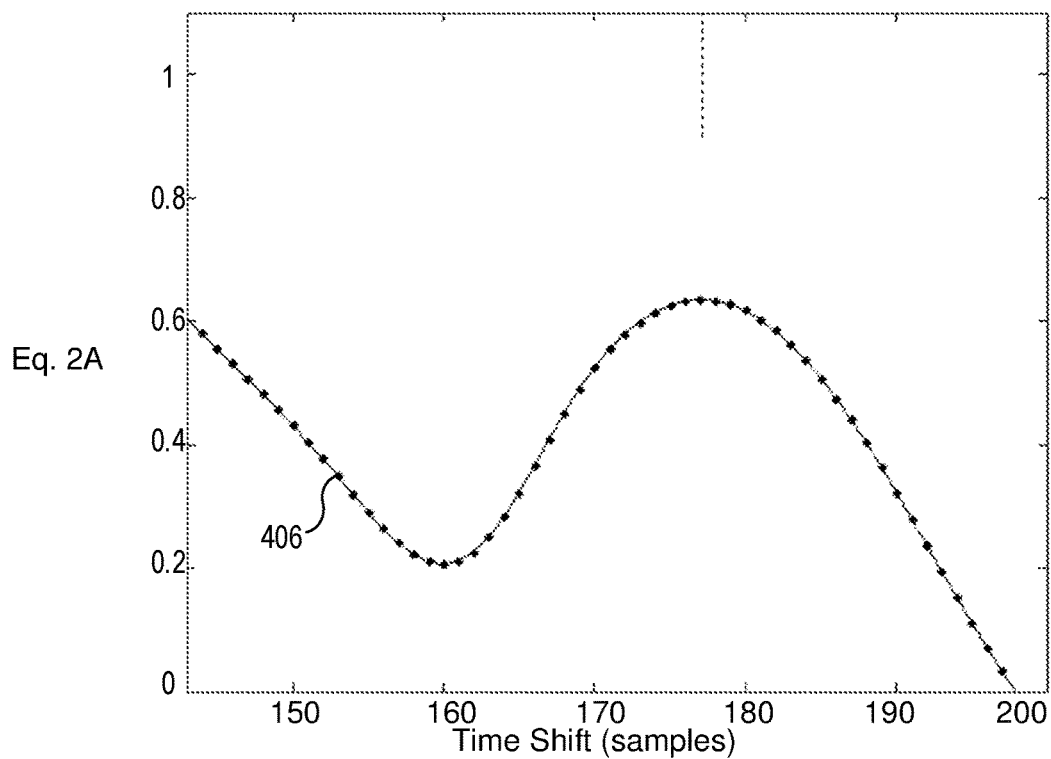
FIG. 4D illustrates a function representing a quality indicator over a range of time shift values, represented in terms of samples at 10 kHz, of the waveform illustrated in FIG. 4A.

FIG. 4D illustrates a function 406 representing a quality indicator Eq. 2A over a range time shifts, represented in terms of samples at 10 kHz, of the waveform illustrated in FIG. 4A. The maximum equals 0.635, signifying the waveform is not periodic. In various embodiments, such a threshold may be applied to the value of Eq. 2A to determine whether a waveform is periodic. In one specific embodiment, the threshold may be 0.95.

Figure 5:
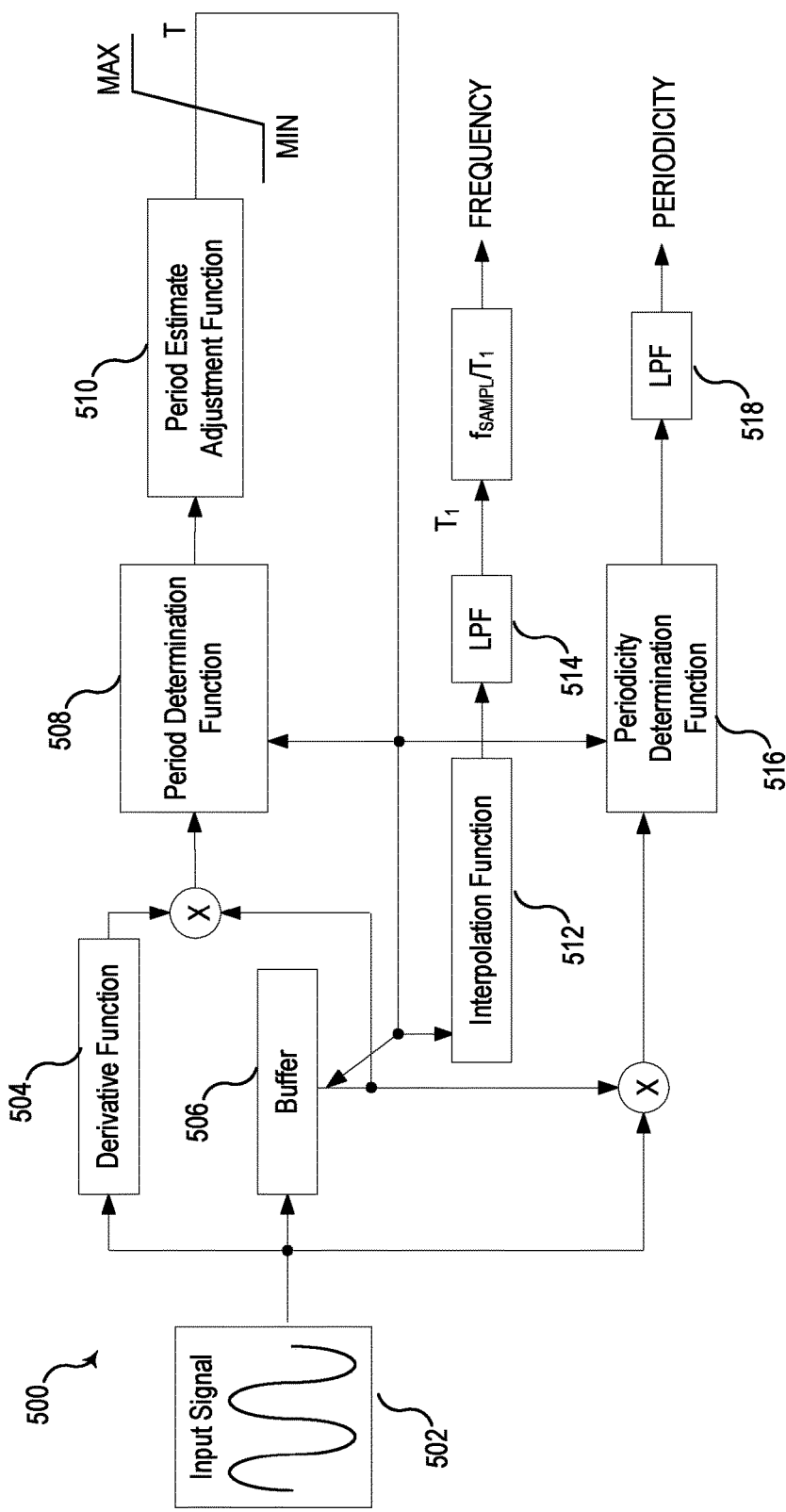
FIG. 5 illustrates a block diagram of a system configured to determine the frequency and an indicator of periodicity of an input signal consistent with embodiments of the present disclosure.

FIG. 5 illustrates a block diagram of a system configured to determine the frequency and an indicator of periodicity of an input signal consistent with embodiments of the present disclosure. System 500 receives an input signal 502. In various embodiments, input signal 502 may comprise a representation of an alternating voltage or current in an electrical power system. The input signal may be an input to a derivative function 504 and a buffer 506. The output of the derivative function 504 and the buffer may be multiplied and provided as an input to a period determination function 508. In various embodiments consistent with the present disclosure, period determination function 508 may solve Eq. 3A and 3B.

The output of the period determination function 508 may be an input to a period estimate adjustment function 510. The period estimate adjustment function 510 may be configured to increase or decrease an estimate of the period of the waveform based on the result of the period determination function 508. In embodiments in which period determination function 508 implements Eq. 3A, if the result is positive, the period may be increased in a successive iteration; if the result is negative, the period may be decreased in a successive iteration.

An interpolation function may be used to interpolate the value of the period. As described above, the output of the period determination function 508 may be positive if the present period estimate is below the actual period, and negative if the present period estimate is above the actual period. In some embodiments, interpolation function 512 may be interpolated between successive samples of the estimated period that result in a sign change in the output of period determination function 508.

The output of the interpolation function 512 may be passed through a low pass filter 514. Low pass filter 514 may increase the accuracy of the frequency calculation obtained from interpolation. The lower the cut-off frequency of low pass filter 514, the better the accuracy and the slower the response time of the algorithm (the lag between the true and measured frequency). Low-pass filter 514 may provide a simple and effective way to control accuracy-versus-speed performance requirements. In various embodiments, low pass filter 514 may be set at about 15 Hz in order to allow frequency changes as fast at 15 Hz/s. In one specific embodiment, two filters may be used: one for frequency metering purposes and the other for frequency protection or frequency tracking purposes.

In some embodiments, the output of system 500 may output the frequency, rather than the period of the waveform. In such embodiments, the frequency is determined as the sampling frequency divided by the period.

A periodicity determination function 516 may be configured to determine the extent to which the input signal 502 is periodic. In some embodiments, periodicity determination function 516 may determine the periodicity of the input signal 502 using Eq. 2A. In some embodiments, the periodicity may reflect a numerical value reflecting the extent to which the input signal 502 is periodic. In some embodiments, a value of 1 may be used to quantify a completely periodic waveform. A value below, but close to 1 may reflect a nearly-periodic waveform, such as a frequency ramp, magnitude ramp, or oscillations in an electric power system.

A value substantially below 1 may quantify a non-periodic waveform. In some embodiments, a threshold value may be established to differentiate between periodic and non-periodic waveforms.

The output of periodicity determination function 516 may also be passed through a low pass filter 518 to improve the accuracy of the periodicity output and to provide time coherency between the filtered period T1 and the periodicity value.

Figure 6A:
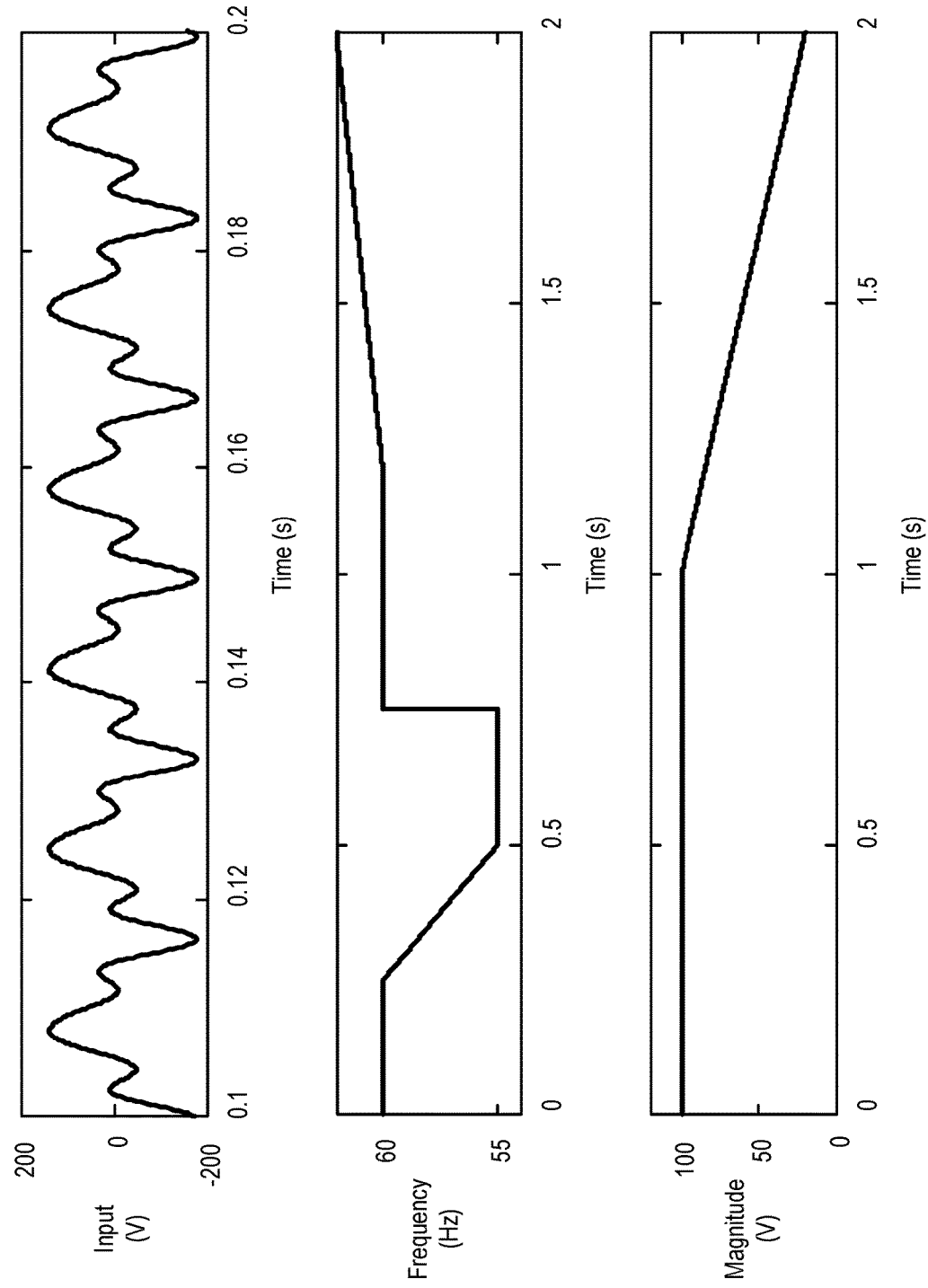
FIG. 6A illustrates plots over time of a heavily distorted waveform, together with a plot of frequency and magnitude changing over time consistent with embodiments of the present disclosure.

FIG. 6A illustrates plots over time of a heavily distorted waveform, together with a plot of the frequency and magnitude changing over time consistent with embodiments of the present disclosure. As illustrated, the frequency declines at 20 Hz/s, exhibits a step change by 5 Hz, and later increases at 2.5 Hz/s. The magnitude of the fundamental frequency begins a decline at t=1 second. FIG. 6B shows the actual period, the raw period interpolated between samples, and the final period estimate after low-pass filtering, for a fraction of the test time. The measurement error in the steady state is small, on the order of 0.6 mHz. FIG. 6C shows the actual and measured frequencies and illustrates how well the new algorithm tracks frequency despite magnitude changes and significant harmonic distortions in the input signal.

Figure 6D:
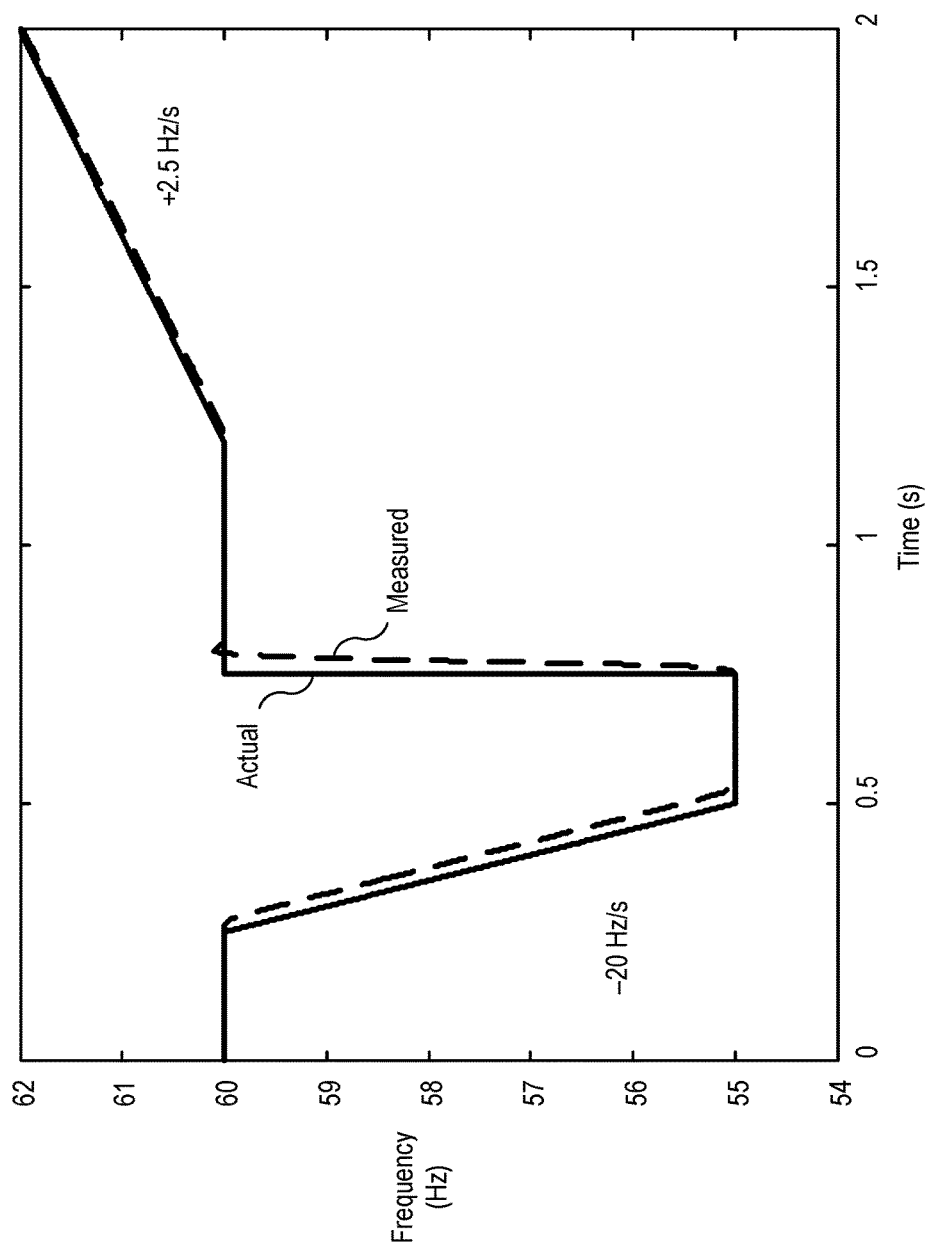
FIG. 6D illustrates a comparison between an actual frequency of the input signal, which is also illustrated in FIG. 6A, and a response of a frequency measurement system consistent with embodiments of the present disclosure.

FIG. 6D illustrates a comparison between an actual input signal, which is also illustrated in FIG. 6A, and a response of a system consistent with embodiments of the present disclosure. As illustrated, the system closely tracks the input signal in spite of the distortions in the signal.

FIG. 7 illustrates plots over time of an input voltage waveform including a switching event (phase jump by 90 degrees at t=0.3 s), an actual and a measured frequency associated with the input signal, and a quality-of-measurement value consistent with embodiments of the present disclosure. As illustrated, the frequency measurement is affected during the phase jump that occurs at t=0.3s. Specifically, upon occurrence of the phase jump the measured frequency begins to increase. After increasing for a period, the measured frequency begins to decrease and returns to the initial value after a few cycles of the input waveform.

The quality-of-measurement index decreases as the error between the measured and actual frequency values diverges. A threshold 702 may differentiate between valid and invalid frequency measurements. As illustrated, following the phase jump, the quality-of-measurement index value falls below threshold 702, and as such may trigger various techniques for addressing the disparity between the measured and the actual frequency values. In one specific embodiment, the last valid frequency measurement may be held until the quality-of-measurement index exceeds a threshold 702.

The results illustrated in FIG. 7 include several desirable attributes. Specifically, the results show a quick recovery from the phase jump. In the illustrated example, the frequency measurement is marked as invalid for about 40 ms, which may correspond to the time needed to pass through the data window used to determine the frequency value. In addition, the measured frequency accurately tracks the frequency of the input waveform in spite of heavy distortion, including multiple zero crossings within each fundamental frequency period.

Figure 8:
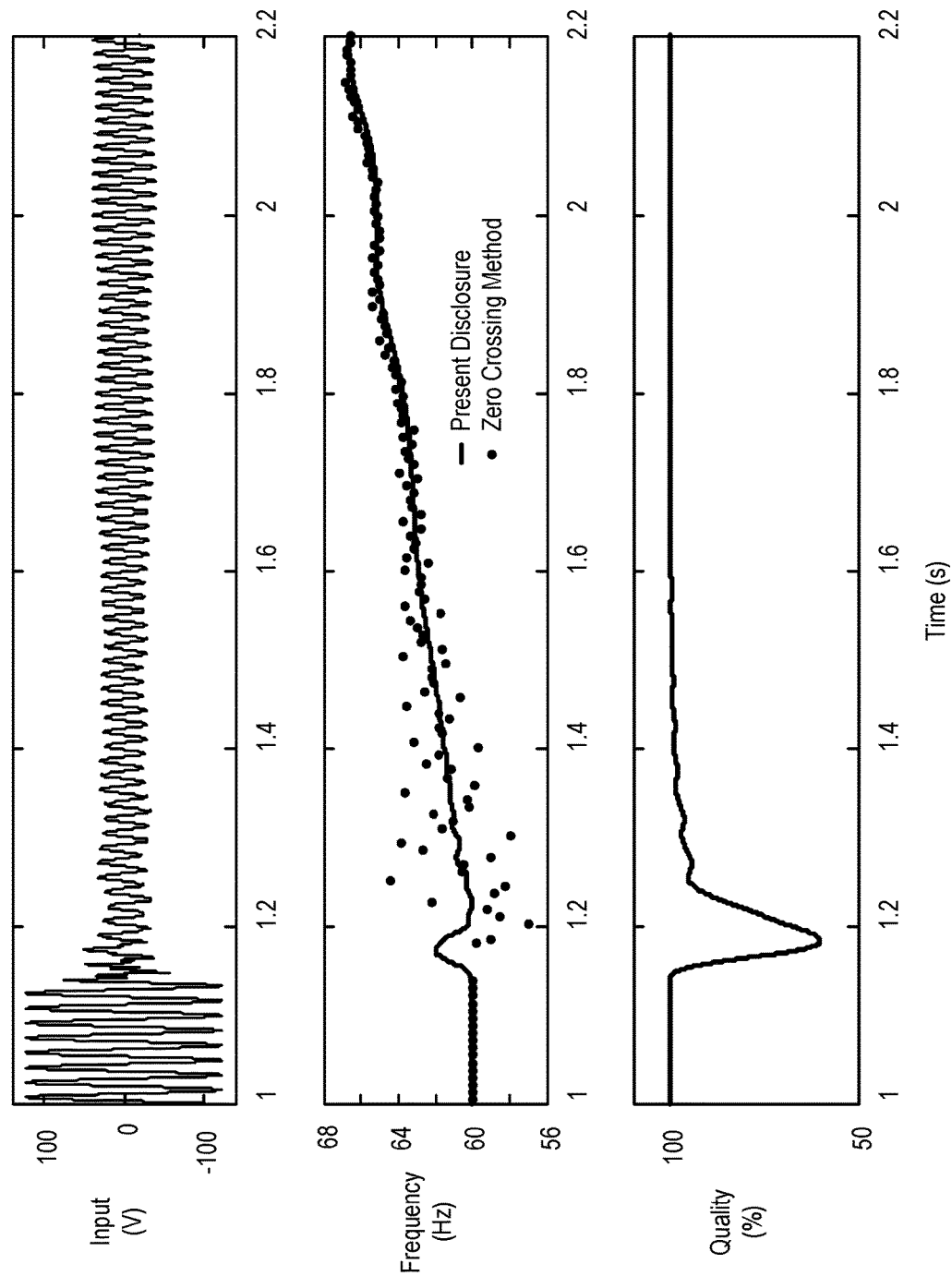
FIG. 8 illustrates plots over time of an input voltage waveform from a low-inertia generator showing subsynchronous oscillations and a fast-frequency ramp after the generator becomes electrically islanded after clearing a fault, a frequency measurement consistent with embodiments of the present disclosure, frequency measurement based on the common zero-crossings method, and a quality-of-measurement value consistent with embodiments of the present disclosure.

FIG. 8 illustrates plots over time of an input voltage waveform from a low-inertia generator showing subsynchronous oscillations and a fast-frequency ramp after the generator becomes electrically islanded after clearing a fault, a frequency measurement using a zero-crossings method, a frequency measurement consistent with the present disclosure and a quality-of-measurement value consistent with embodiments of the present disclosure. The illustration in FIG. 8 illustrates desirable performance in comparison to the zero-crossing approach (modeled with no prefiltering). The quality-of-measurement index correctly identifies frequency measurements that are less accurate and which may be excluded from downstream applications of frequency.

In some embodiments, systems and methods consistent with the present disclosure may provide accuracy on the order of ten mHz or better. Typical system conditions may include frequency excursions of ±5 Hz and frequency ramps of up to ±15 Hz/s. Inertia-free inverter-based power sources pose higher requirements than the traditional requirements listed above. Various embodiments of the present disclosure may satisfy such requirements.

Figure 9:
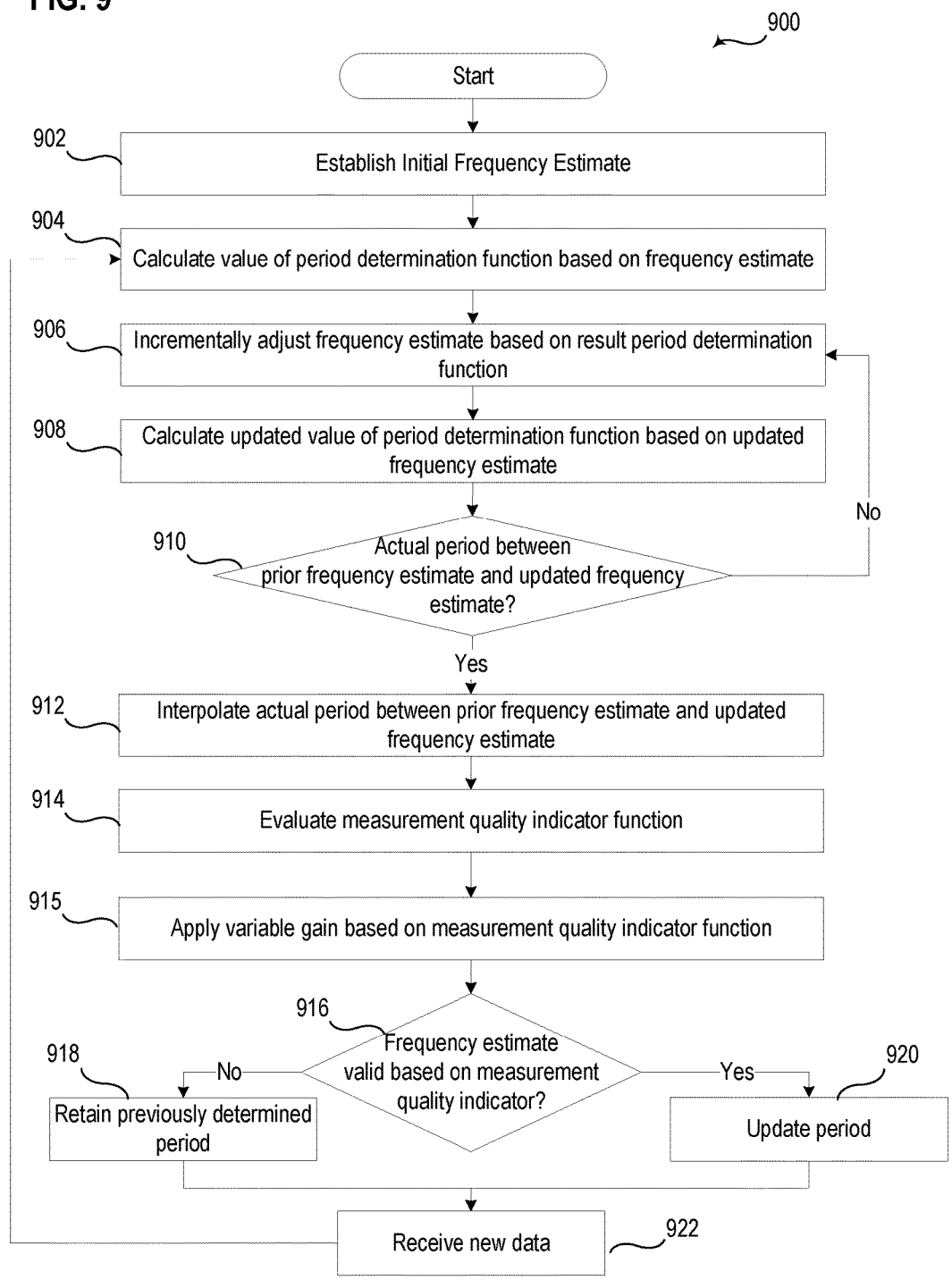
FIG. 9 illustrates a flowchart of a method for estimating the period of a waveform consistent with embodiments of the present disclosure.

FIG. 9 illustrates a flowchart of a method 900 for estimating the period of a waveform consistent with embodiments of the present disclosure. Method 900 may incrementally determine the period of the waveform and then track the period as new data is received. At 902, an initial frequency estimate may be established. The estimate is not necessarily based on information associated with the waveform. Rather, the initial estimate may simply be a starting point. In some embodiments, the initial frequency estimate may be set at a nominal frequency for a system. At 904, the value of a period determination function may be calculated based on the frequency estimate. In certain embodiments, the period determination may utilize Eq. 3. In such embodiments, the sign (i.e., whether the result is positive or negative) of the result of Eq. 3 may provide an indication of whether the frequency estimate is above or below the actual frequency. At 906, the frequency estimate may be incrementally adjusted based on the result of the period determination function. In some embodiments, the value may be incremented or decremented in specific quantities (e.g., one sample). At 908, an updated value of the period determination function may be calculated based on the updated frequency estimate.

At 910, method 900 may determine whether the actual period of the waveform falls between the prior frequency estimate and the updated frequency estimate. The determination may be based, in some embodiments, on the result of the period determination function. In one specific embodiment in which Eq. 3 is used in connection with the period determination function, the sign of the result may switch depending on whether the updated frequency estimate is above or below the actual frequency. As such, a change in the sign of the result of Eq. 3 may cause method 900 to diverge at 910. If the actual period is not determined to be between the prior frequency estimate and the current frequency estimate, method 900 may return to 906.

At 912, method 900 may interpolate the value of the actual period of the waveform between the prior frequency estimate and the updated frequency estimate. In various embodiments, Eq. 2 may be implemented directly by replacing the continuous time integrals with sums of a plurality of samples. Interpolation can be used to find the maximum of Eq. 2A between two integer samples of T. Accordingly, the system may use another interpolation to delay the signal by exactly one period (including the fractional period), and the system may avoid another interpolation to run the sums over an exact period (including the fractional period). Instead, the system may run calculations for values of period expressed in integer number of samples.

At 914, a measurement quality indicator function may be evaluated. In various embodiments, Eq. 2 may provide an indication of the periodicity of the waveform, and thus, an indication of the quality of the determined period is valid. In some embodiments, at 915, a variable gain may be applied based on the quality indicator function. The variable gain may be applied after a filtering process, in embodiments that utilize a filter. The variable gain may increase the relative weight of data samples when the quality indicator function indicates that the input function is highly periodic, and to decrease the relative weight of data samples when the quality indicator function indicates that the input function is non-periodic. In some embodiments the variable gain may be embodied as a non-linear function based on the quality indicator function.

At 916, method 900 may determine whether the determined period is valid based on quality indicator. If the evaluation indicates a low quality at 916, the previously determined period may be retained at 918. On the other hand, if the evaluation indicates a high quality at 916, the updated frequency may generate an updated period at 920. In various embodiments, the frequency measurement may be used and analyzed by method 900 to track the frequency during operation of a system.

Additional data may be received at 922, and method 900 may return to 904. In various embodiments, method 900 may be performed immediately upon receipt of new data. In one specific embodiment, receipt of new data may be tied to internal device processes such as the waveform sampling process, rather than in response to an external event (e.g., zero crossing).

Figure 10:
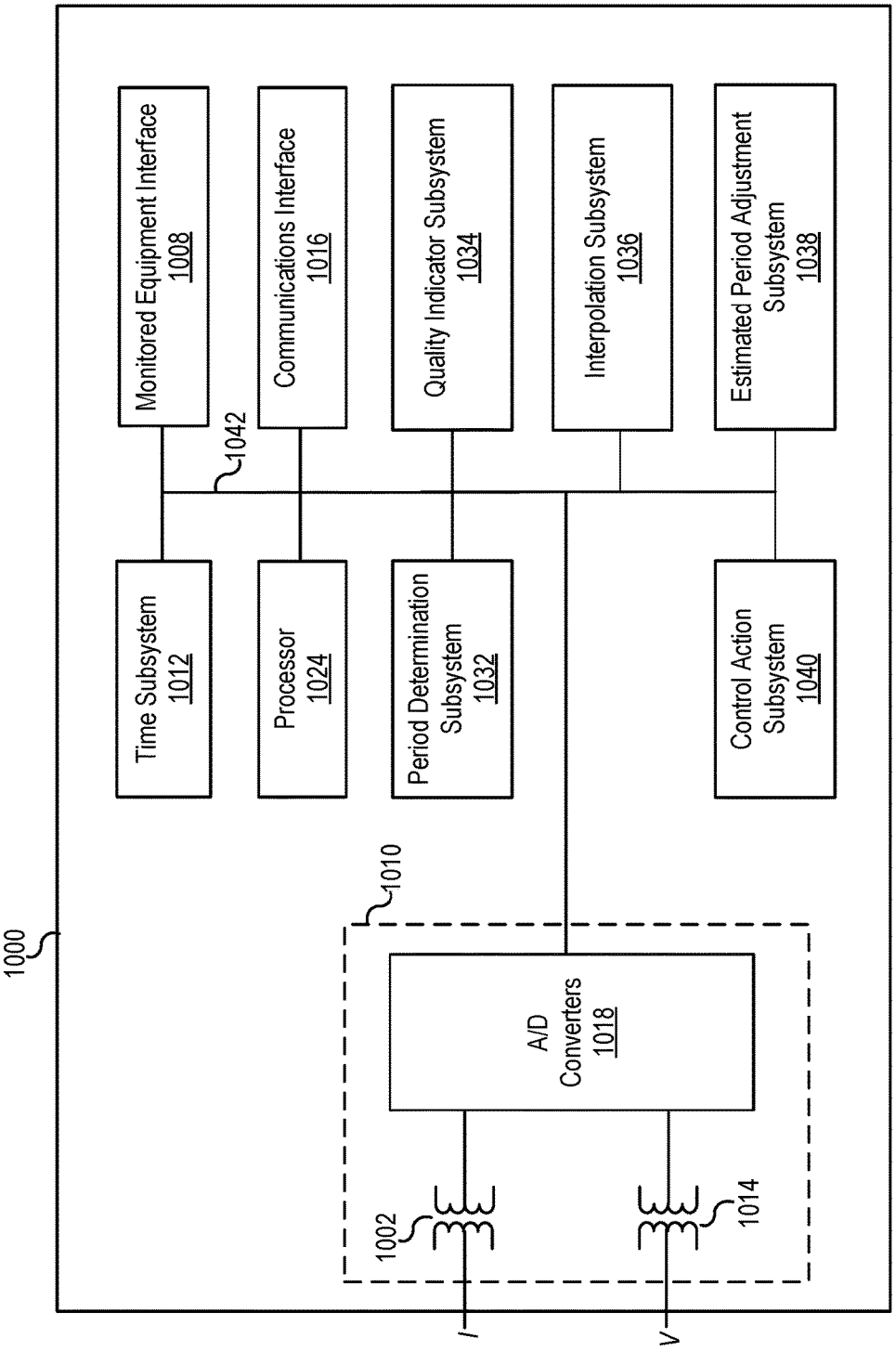
FIG. 10 illustrates a functional block diagram of a system configured to estimate the period of a waveform consistent with embodiments of the present disclosure.

FIG. 10 illustrates a functional block diagram of a system 1000 configured to estimate the period of a waveform consistent with embodiments of the present disclosure. System 1000 may be implemented using hardware, software, firmware, and/or any combination thereof. Moreover, certain components or functions described herein may be associated with other devices or performed by other devices. The specifically illustrated configuration is merely representative of one embodiment consistent with the present disclosure. In certain embodiments, the system 1000 may comprise an IED. The specifically illustrated configuration is merely representative of one embodiment consistent with the present disclosure.

System 1000 may include a communications interface 1016 configured to communicate with other devices and/or systems. In certain embodiments, the communications interface 1016 may facilitate direct communication with another device or may communicate with one or more devices using a communications network. Communications interface 1016 may be configured for communication using a variety of communication media and data communication protocols (e.g., Ethernet, IEC 61850, etc.).

System 1000 may further include a time subsystem 1012, which may be used to receive a time signal (e.g., a common time reference) allowing system 1000 to apply a time-stamp to the acquired samples. In various embodiments, time subsystem 1012 may comprise a GNSS receiver, IRIG-B receiver, a WWVB or WWV receiver and the like. In certain embodiments, a common time reference may be received via communications interface 1016, and accordingly, a separate time input may not be required for time-stamping and/or synchronization operations. One such embodiment may employ the IEEE 1588 protocol.

Time subsystem 1012 may further be configured to associate a time stamp based on the common time signal with representations of electrical conditions on the output of one or more electrical generators or one or more electrical buses. Using such time-stamped representations, system 1000 may determine whether a generator is synchronized to an electrical bus to which the generator is to be connected.

A monitored equipment interface 1008 may be configured to receive status information from, and issue control instructions to, a piece of monitored equipment (such as a circuit breaker, recloser, etc.). In various embodiments monitored equipment interface 1008 may be in communication with one or more breakers or re-closers that may selectively connect or disconnect an electrical load. The monitored interface may be used in various embodiments to implement control instructions based on the frequency of a monitored waveform.

Processor 1024 may be configured to process communications received via communications interface 1016, time subsystem 1012, and/or monitored equipment interface 1008. Processor 1024 may operate using any number of processing rates and architectures. Processor 1024 may be configured to perform various algorithms and calculations described herein. Processor 1024 may be embodied as a general purpose integrated circuit, an application specific integrated circuit, a field-programmable gate array, and/or any other suitable programmable logic device.

In certain embodiments, system 1000 may include a sensor component 1010. In the illustrated embodiment, sensor component 1010 is configured to gather data directly from equipment such as a conductor (not shown) and may use, for example, transformers 1002 and 1014 and A/D converters 1018 that may sample and/or digitize filtered waveforms to form corresponding digitized current and voltage signals provided to data bus 1042. Current (I) and voltage (V) inputs may be secondary inputs from instrument transformers such as, CTs and VTs, connected to a generator output or an electrical bus. A/D converters 1018 may include a single A/D converter or separate A/D converters for each incoming signal. A/D converters 1018 may be connected to processor 1024 by way of data bus 1042, through which digitized representations of current and voltage signals may be transmitted to processor 1024.

A period determination subsystem 1032 may be configured to analyze data associated with a waveform and determine a period of the waveform. In various embodiments consistent with the present disclosure, period determination subsystem 1032 may solve Eq. 3 using various techniques disclosed herein. In other embodiments, period determination subsystem 1032 may solve Eq. 1, or other functions from which the period of a waveform may be determined. In some embodiments, period determination subsystem 1032 may further be configured to implement a low pass filter to improve the accuracy of the determined waveform period.

A quality indicator subsystem 1034 may be configured to determine the quality of an estimated period determined by period determination subsystem 1032. In some embodiments, quality indicator subsystem 1034 may assess the periodicity of the input waveform using Eq. 2 and various techniques disclosed herein. In some embodiments, the quality may be reflected as a numerical value indicating the periodicity of the input signal. In some embodiments, a value of 1 may be used to quantify a completely periodic waveform. A value below, but close to 1, may reflect a nearly-periodic waveform, such as a frequency ramp, magnitude ramp, or oscillations in an electric power system. A value substantially below 1 may quantify a non-periodic waveform. In some embodiments, a threshold value may be established to differentiate between periodic and non-periodic waveforms. In some embodiments, quality indicator subsystem 1034 may further be configured to implement a low pass filter to improve the accuracy of the quality indicator subsystem output.

An interpolation subsystem 1036 may be configured to interpolate the value of the period. In some embodiments, interpolation subsystem 1036 may interpolate between successive samples in order to more accurately estimate the period of a waveform.

An estimated period adjustment subsystem 1038 may be configured to increase or decrease an estimate of the period of the waveform. In some embodiments, period estimate adjustment subsystem may be incrementally adjusted to determine the period of the waveform period. In embodiments in which period determination subsystem 1032 implements Eq. 3A, estimated period adjustment subsystem 1038 may increase the estimated period in a successive calculation if the result is positive, and may decrease the estimated period in a successive calculation if the result is negative.

A control action subsystem 1040 may be configured to implement a control action based on a determination of the period of a waveform. Changes in the frequency of an alternating current associated with an electric power distribution system may provide an indication of changes within the system. For example, where the system is overloaded, the frequency may begin to decline. In such circumstances, system 1000 may detect the declining frequency and may reduce the load connected to the system by implementing a control action. Shedding of loads is merely one example of a control action that may be implemented based on a change in frequency detected by system 1000.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. Moreover, principles described herein may also be utilized for protecting an electric system from over-frequency conditions, wherein power generation would be shed rather than load to reduce effects on the system. Accordingly, many changes may be made to the details of the above-described embodiments without departing from the underlying principles of this disclosure. The scope of the present invention should, therefore, be determined only by the following claims.

What is claimed is:

1. A system configured to determine a variable period of an input waveform, the system comprising:
   an input configured to receive a representation of the input waveform;
   a period determination subsystem configured to perform an iterative process to determine the variable period of the input waveform, the iterative process comprising:
   selection of an estimated window length;
   determination of an autocorrelation value based on the estimated window length;
   determination of an adjustment value to the window length to identify a maximum of the autocorrelation value; and
   determination of the variable period based on the window length associated with the maximum of the autocorrelation value; and
   a control action subsystem configured to implement a control action based on the variable period of the input waveform
   wherein the period determination subsystem is further configured to perform the iterative process to track changes in the variable period of the input waveform.

2. The system of claim 1, further comprising a variable length buffer configured to receive the input waveform and to provide to the period determination subsystem the representation of the input waveform that is delayed by the estimated window length.

3. The system of claim 2, further comprising a derivative function subsystem configured to receive the input waveform and to provide the representation of a derivative of the input waveform to the period determination subsystem;
   wherein the period determination subsystem is further configured to utilize the derivative of the input waveform to determine one of the window length and the adjustment value to the window length.

4. The system of claim 3, wherein the period determination subsystem is configured to determine the adjustment value to the window length based on a delay of the input waveform provided by the variable length buffer that results in a zero value of an integrated product of the input waveform and the derivative of the input waveform at the delay.

5. The system of claim 1, wherein the period determination subsystem is further configured to interpolate between a plurality of adjacent values of the input waveform to determine the estimated period.

6. The system of claim 1, further comprising a periodicity determination subsystem configured to evaluate a periodicity of the input waveform and to provide a measurement quality indicator based on the periodicity of the input waveform for each of a corresponding plurality of values of the variable period over a span of time.

7. The system of claim 6, wherein the periodicity determination subsystem is further configured to generate a composite value of the variable period over the span of time based on the measurement quality indicator and the corresponding plurality of values of the variable period.

8. The system of claim 7, wherein the composite value of the variable period comprises a weighted average, and the quality indictor comprises a weighting value associated with the plurality of values of the variable period in the weighted average.

9. The system of claim 6, wherein the period determination subsystem is further configured to selectively discard values of the variable period when the measurement quality indicator is below a threshold.

10. The system of claim 1, wherein the input waveform represents one of an alternating current and an alternating voltage in an electric power distribution system.

11. The system of claim 1, wherein the control action comprises disconnection of a load connected to the electric power distribution system when the variable period exceeds a threshold.

12. A method for determining a variable period of an input waveform, the method comprising:
   receiving a representation of the input waveform; and
   performing an iterative process to determine the variable period of the input waveform, the iterative process comprising:
   selecting an estimated window length;
   determining an autocorrelation value based on the estimated window length;
   determining an adjustment value to the window length to identify a maximum of the autocorrelation value; and
   determining the variable period based on the window length based on the window length associated with the maximum of the autocorrelation value;

a control action subsystem configured to implement a control action based on the period of the input waveform;

wherein the period determination subsystem is further configured to perform the iterative process to track changes in the variable period of the input waveform.

13. The method of claim 12, further comprising delaying the input waveform using a variable length buffer by the estimated window length.

14. The method of claim 13, further comprising:
generating a derivative of the input waveform; and
utilizing the derivative to determine one of the window length and the adjustment value to the window length.

15. The method of claim 14, wherein determining the adjustment value to the window length based on a delay of the input waveform provided by the variable length buffer comprises selecting the delay resulting in a zero value of an integrated product of the input waveform and the derivative of the input waveform at the delay.

16. The method of claim 12, further comprising interpolating between a plurality of adjacent values of the input waveform to determine the estimated period.

17. The method of claim 12, further comprising:
evaluating a periodicity of the input waveform; and
providing a measurement quality indicator based on the periodicity of the input waveform for each of a corresponding plurality of values of the variable period over a span of time.

18. The method of claim 17, further comprising generating a composite value of the variable period over the span of time based on the measurement quality indicator and the corresponding plurality of values of the variable period.

19. The method of claim 18, wherein the composite value of the variable period comprises a weighted average, and wherein the quality indictor comprises a weighting value associated with the plurality of values of the variable period.

20. A system configured to monitor a periodic waveform in an electrical power system and to determine a variable period of the periodic waveform, the system comprising:
an input configured to receive a representation of the periodic waveform; and
a period determination subsystem configured to perform an iterative process to determine the variable period of the periodic waveform, the iterative process comprising:
selection of an estimated window length;
determination of an autocorrelation value based on the estimated window length;
determination of an adjustment value to the window length to identify a maximum of the autocorrelation value; and
determination of the variable period based on the window length associated with the maximum of the autocorrelation value;
a periodicity determination subsystem configured to evaluate a periodicity of the periodic waveform and to provide a measurement quality indicator based on the periodicity of the input waveform for each of a corresponding plurality of values of the variable period;
a control action subsystem configured to selectively disconnect a load connected to the electric power distribution system when the variable period exceeds a threshold;
wherein the period determination subsystem is further configured to selectively discard values of the variable period when the measurement quality indicator is below a threshold.

* * * * *